United States Patent
Furuya

(10) Patent No.: US 9,887,515 B2
(45) Date of Patent: Feb. 6, 2018

(54) OPTICAL MODULE, OPTICAL APPARATUS, METHOD FOR FABRICATING OPTICAL MODULE

(71) Applicant: SUMITOMO ELECTRIC INDUSTRIES, LTD., Osaka (JP)

(72) Inventor: Akira Furuya, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/373,329

(22) Filed: Dec. 8, 2016

(65) Prior Publication Data
US 2017/0170627 A1    Jun. 15, 2017

(30) Foreign Application Priority Data

Dec. 9, 2015    (JP) .................. 2015-240467

(51) Int. Cl.
  *H01S 5/022*    (2006.01)
  *H01S 5/042*    (2006.01)

(52) U.S. Cl.
  CPC ...... *H01S 5/02236* (2013.01); *H01S 5/02248* (2013.01); *H01S 5/02252* (2013.01); *H01S 5/02288* (2013.01); *H01S 5/02292* (2013.01); *H01S 5/02296* (2013.01); *H01S 5/0425* (2013.01); *H01S 5/02208* (2013.01)

(58) Field of Classification Search
  CPC ............ H01S 5/02236; H01S 5/02296; H01S 5/02252; H01S 5/02288; H01S 5/0425; H01S 5/02248; H01S 5/02292
  See application file for complete search history.

(56) References Cited

U.S. PATENT DOCUMENTS 5,787,215 A * 7/1998 Kuhara .................. H01L 31/12
                                                   257/E31.095
5,949,654 A * 9/1999 Fukuoka ................ H01L 21/50
                                                   257/700

OTHER PUBLICATIONS

De Dobbelaere, Peter, "Silicon Photonics Technology Platform for High Speed Interconnect", Powerpoint Presentation, Luxtera Proprietary & Confidential, Semicon West, pp. 1-20, 2013, (http://www.semiconwest.org).

* cited by examiner

*Primary Examiner* — Dung Nguyen
(74) *Attorney, Agent, or Firm* — Smith, Gambrell & Russell, LLP

(57) ABSTRACT

An optical module includes a bench part and a cap on the bench part. The bench part includes a bench, an electrode, a semiconductor optical device and a lens. The electrode is disposed on the first and second areas of the bench. The semiconductor optical device is disposed on the electrode in the first area. The cap includes a pad electrode, a conductor, a ceiling, a front wall, a first side wall, a first wing, and a rear wall. The first wing is disposed on the first side wall. The pad electrode is disposed on the first wing, and the conductor is disposed on the cap base and connected to the pad electrode. The electrode is electrically connected to the conductor on the second area. The ceiling extends along a first plane. The front wall has a front outer face extending along a second plane intersecting the first plane.

7 Claims, 24 Drawing Sheets

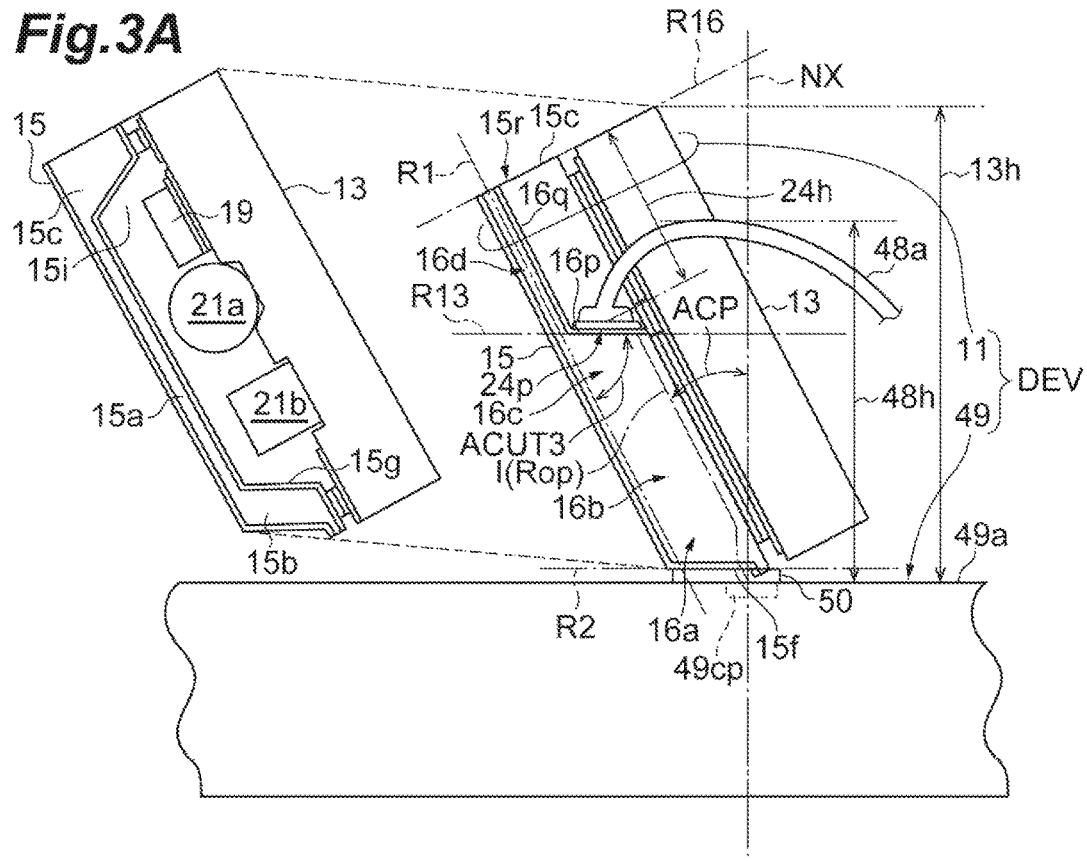
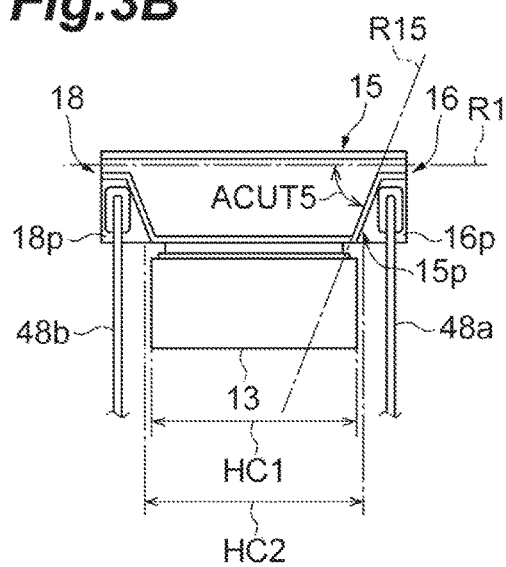
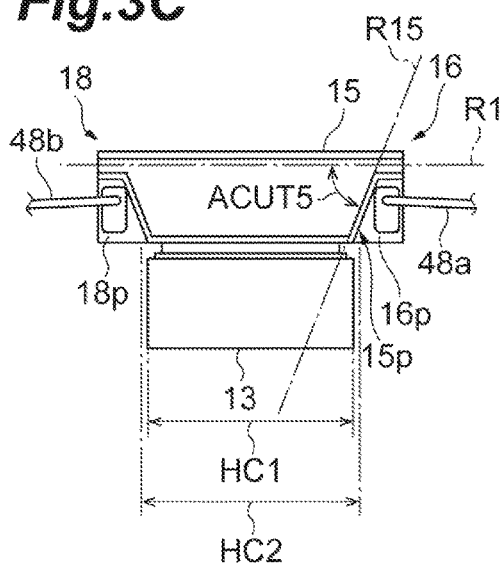

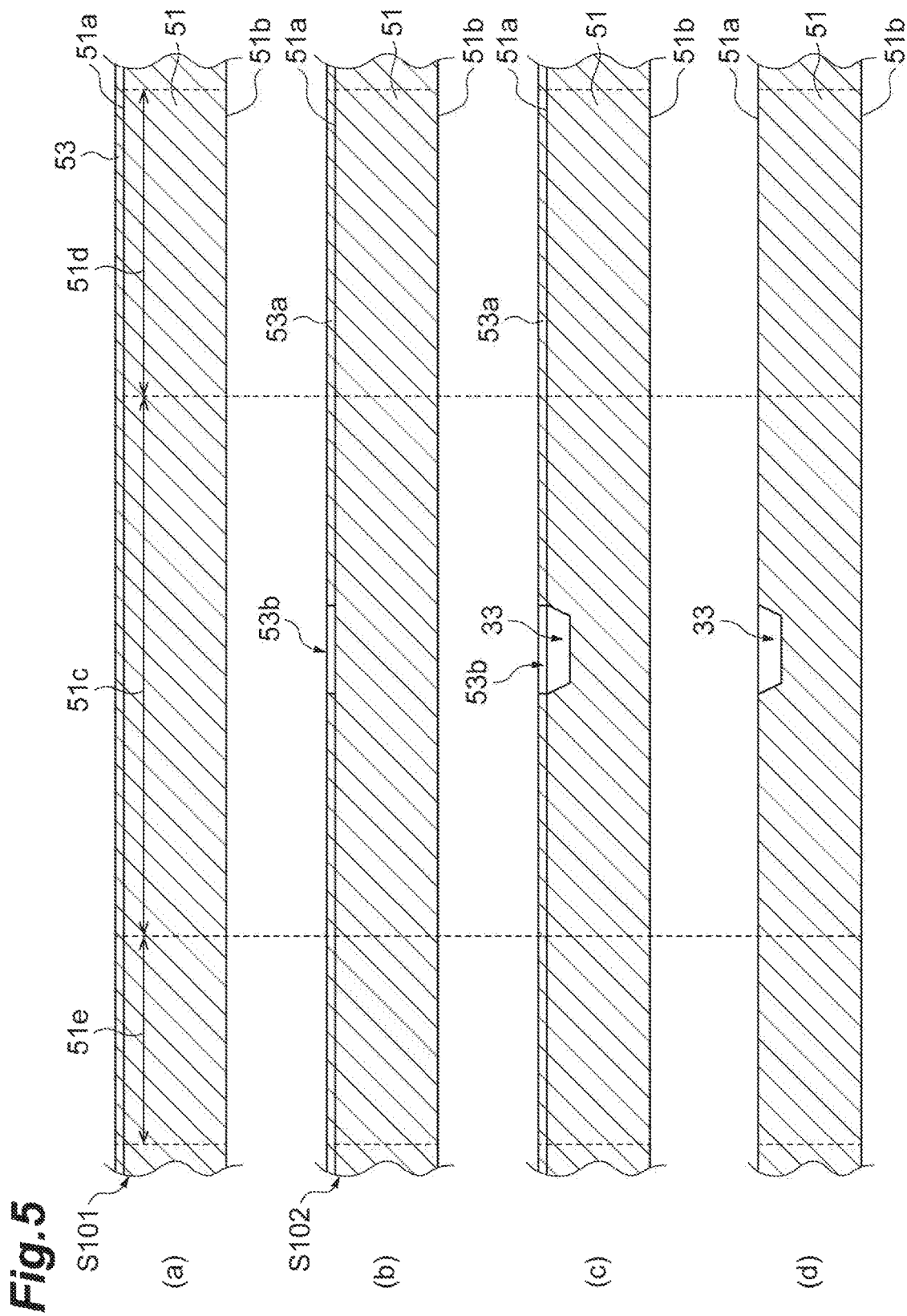

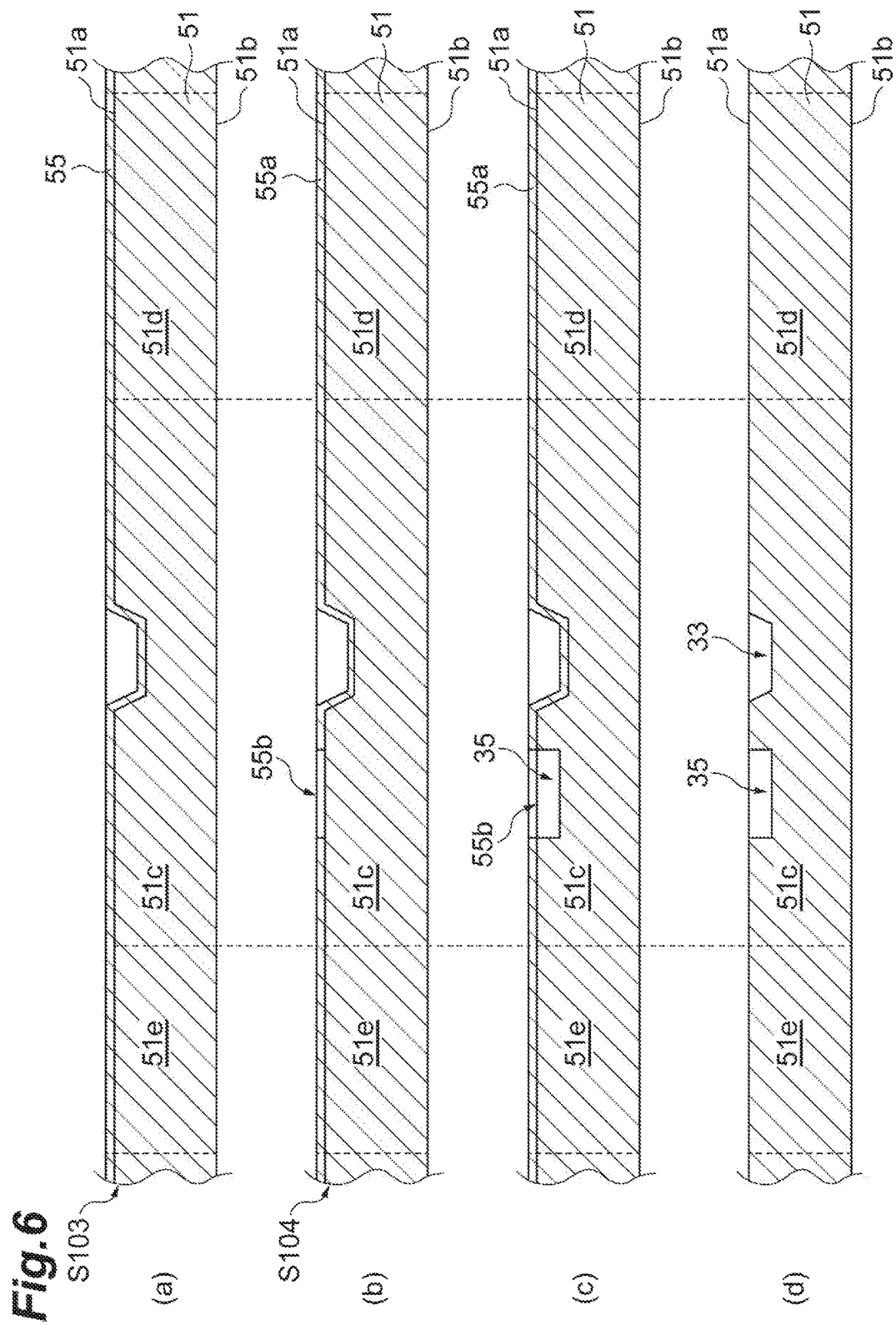

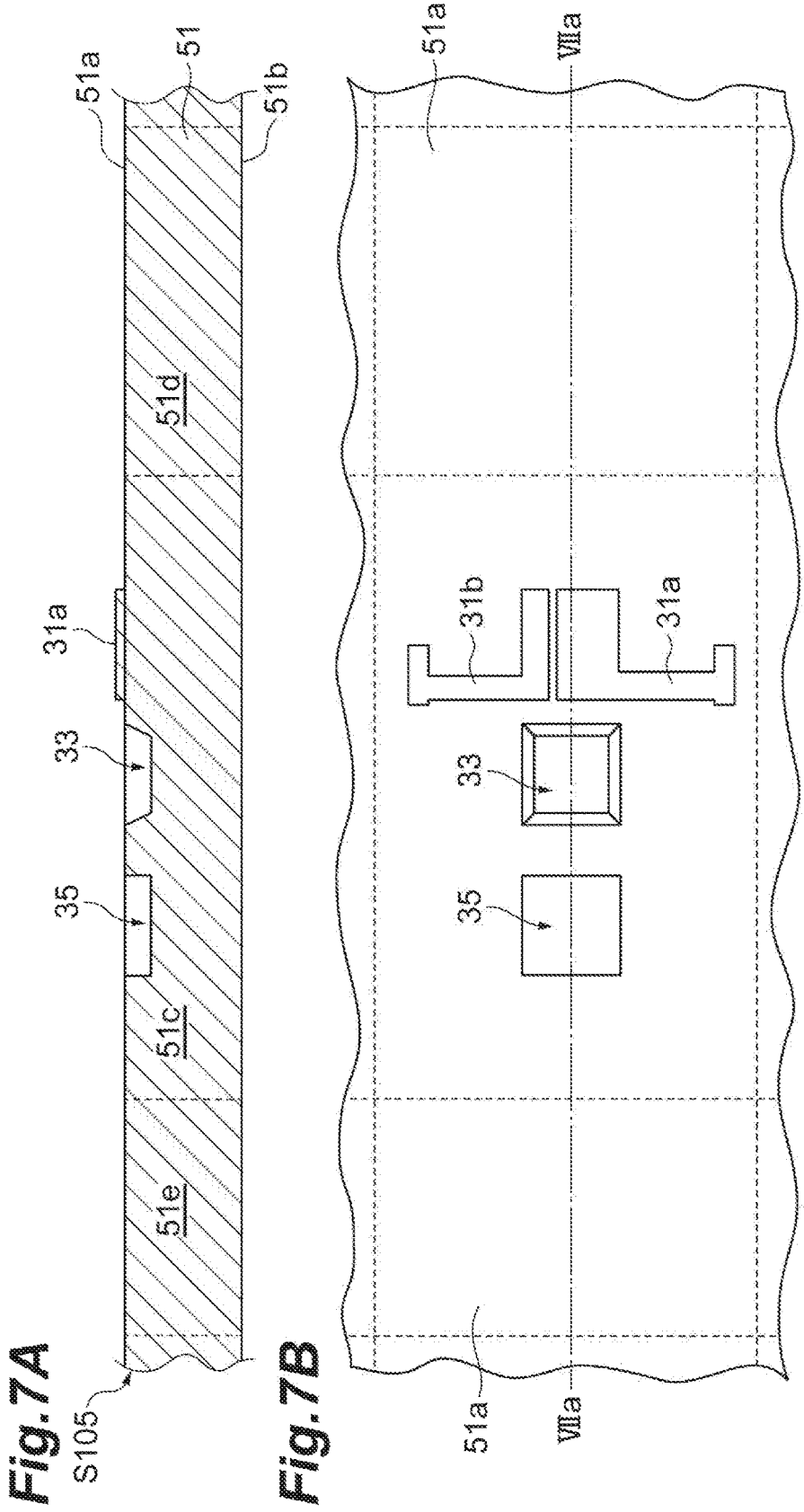

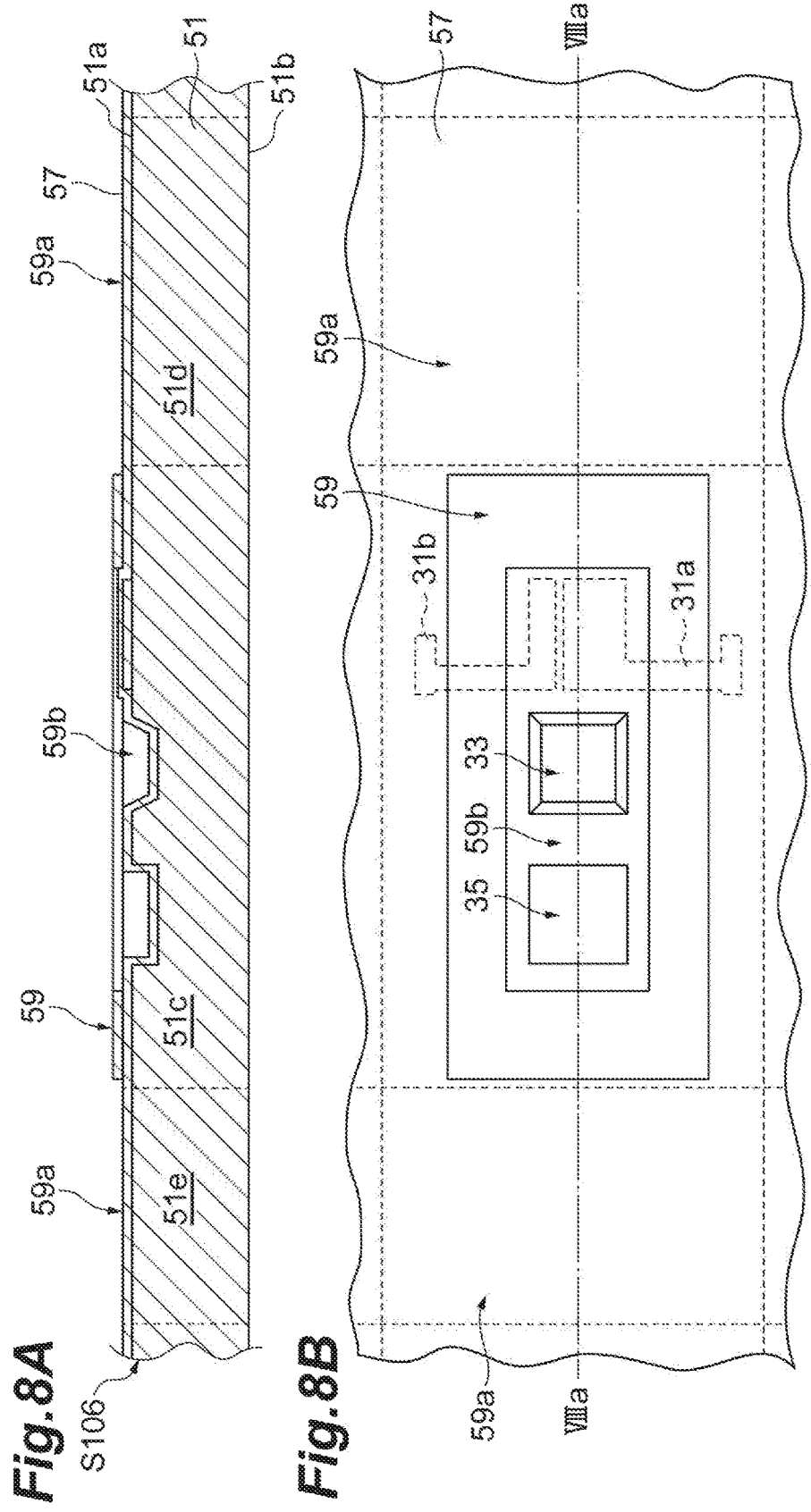

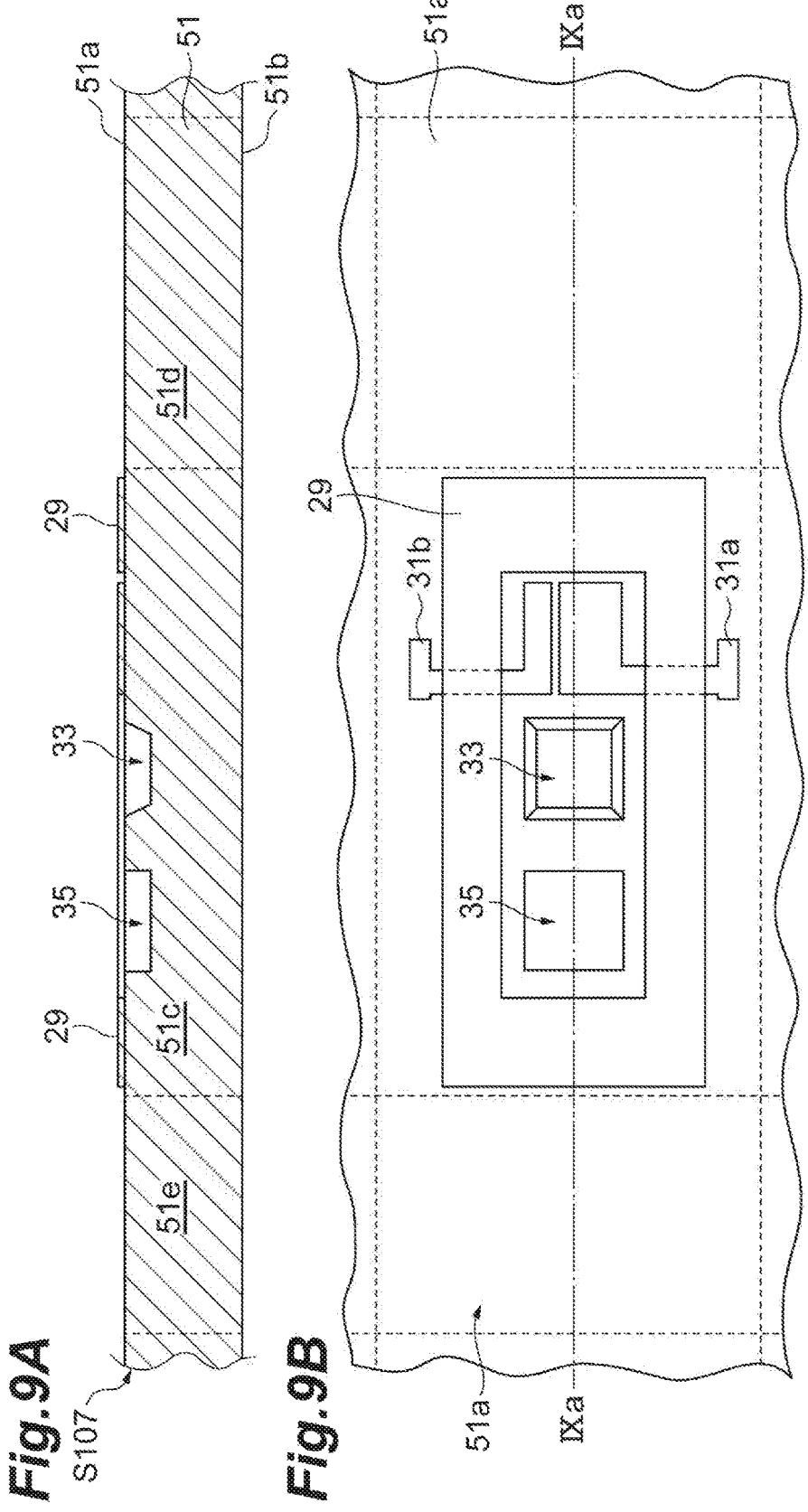

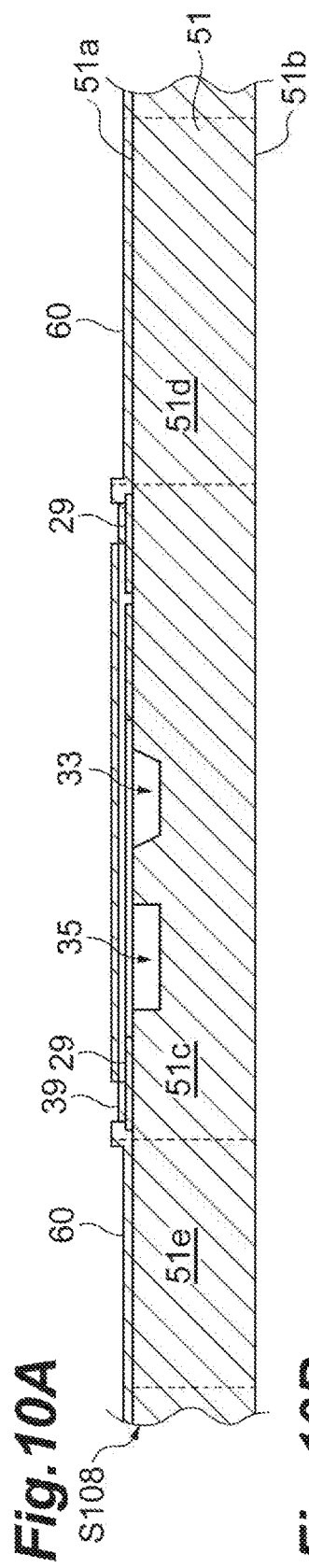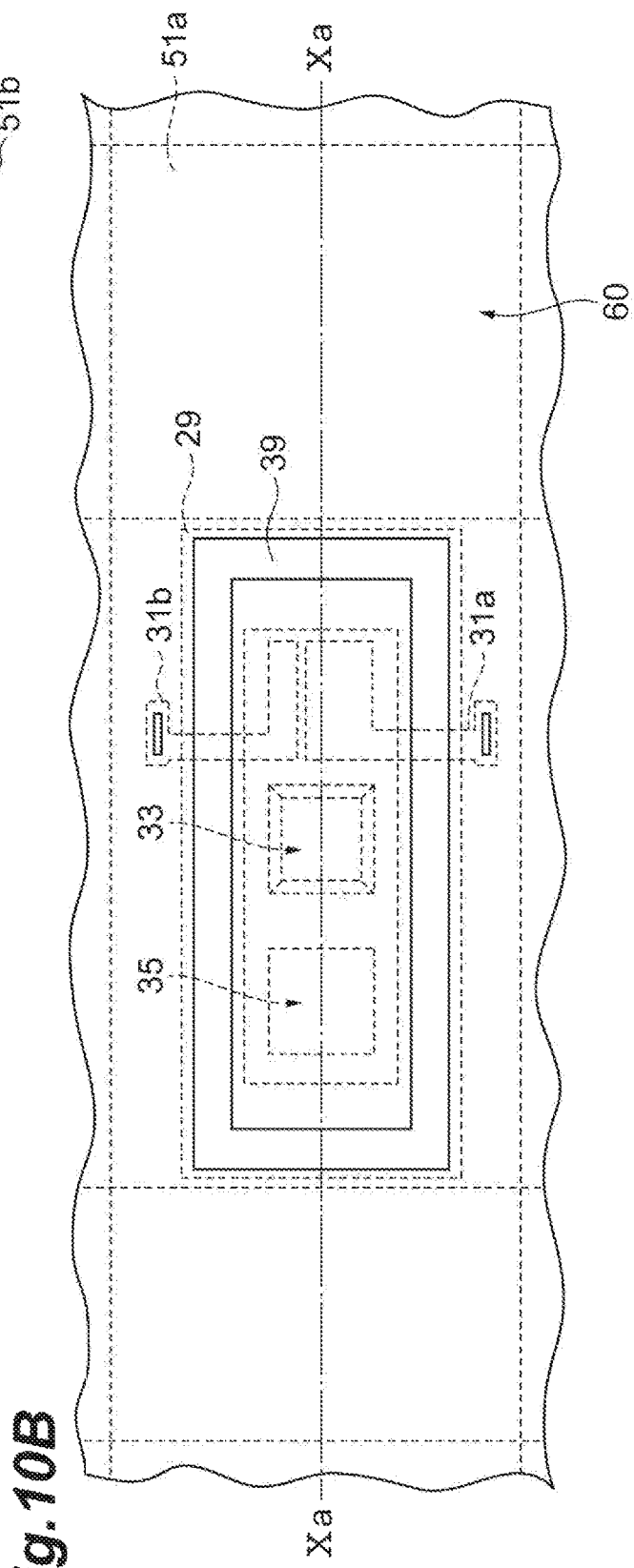

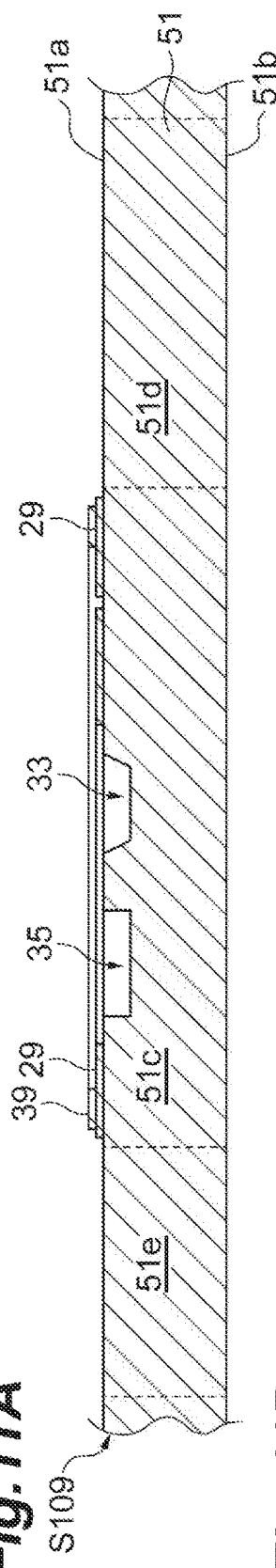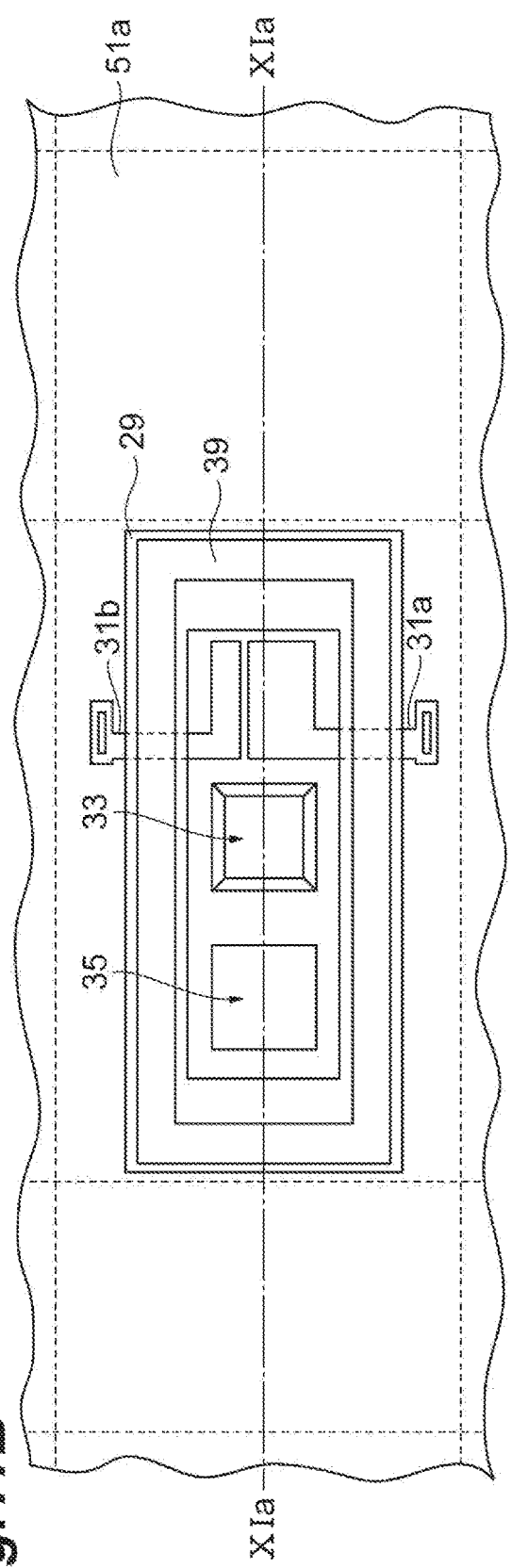

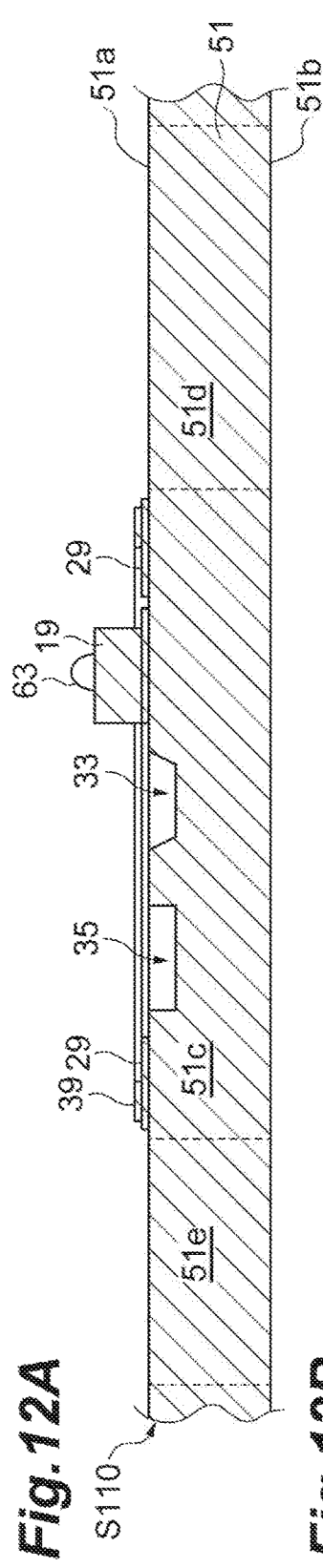
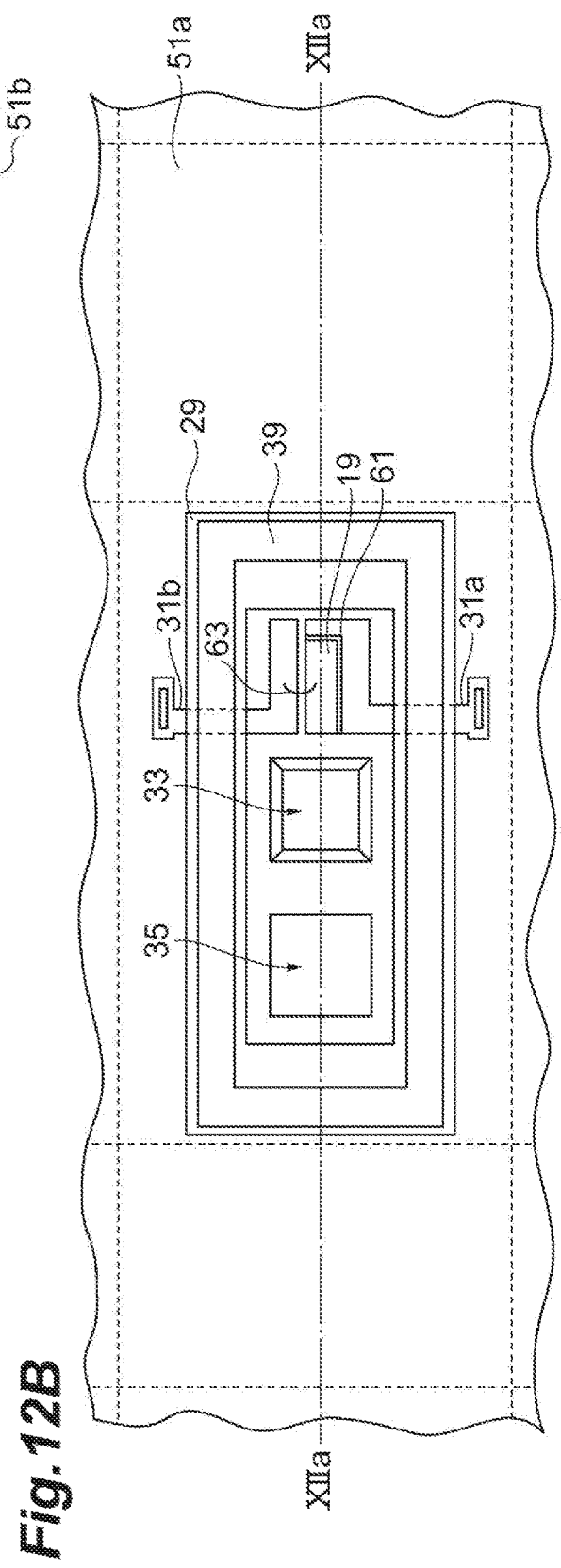

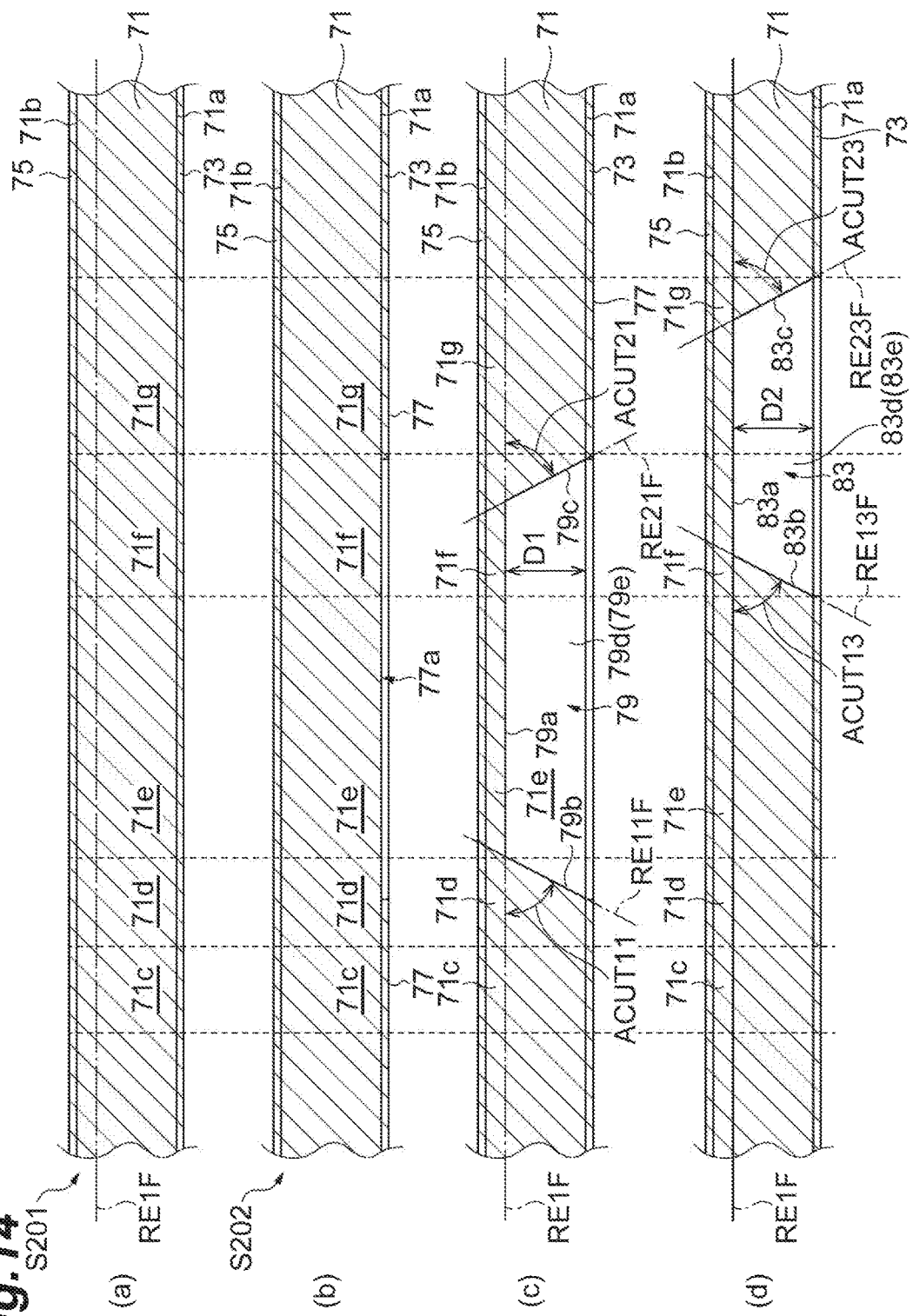

OPTICAL MODULE, OPTICAL APPARATUS, METHOD FOR FABRICATING OPTICAL MODULE

BACKGROUND OF THE INVENTION

Field of the Invention

The present invention relates to an optical module, an optical apparatus, and a method for fabricating an optical module. This application claims the benefit of priority from Japanese Patent Application No. 2015-240467 filed on Dec. 9, 2015, which is herein incorporated by reference in its entirety.

Related Background Art

The following link discloses a compact laser module. http://www.semiconwest.org/sites/semiconwest.org/files/docs/SW201—P.%20De%20Dobbelaere_Luxtera.pdf.

SUMMARY OF THE INVENTION

One aspect of the present invention relates to an optical module. The optical module includes: a bench part including a bench, an electrode, a semiconductor optical device, and a lens, the bench having a principal surface with a first area and a second area, the electrode being disposed on the first area and the second area, the semiconductor optical device being disposed on the electrode in the first area, and the lens being supported by the first area; and a cap disposed on the bench part, the cap including a cap base, a pad electrode and a conductor, the cap including a cavity, a ceiling, a front wall, a first side wall, a first wing, and a rear wall, the cavity containing the semiconductor optical device and the lens, the pad electrode being disposed on the first wing, and the conductor being disposed on the cap base and connected to the pad electrode, the second area of the bench surrounding the first area, the electrode on the second area being electrically connected to the conductor on the cap base, the semiconductor optical device, the lens and the front wall and the rear wall of the cap being arranged on a principal surface of the bench part along an optical reference plane extending in a direction of a first axis, and the ceiling extending along a first reference plane, the front wall having a front outer face extending along a second reference plane, the second reference plane intersecting with the first reference plane, the first wing being disposed on the first side wall, and the rear wall extending from the ceiling in a direction from the cap to the bench.

Another aspect of the present invention relates to an optical apparatus. The optical apparatus includes: an optical module according to one aspect; and an optical part, the optical part supporting the front wall of the optical module, and the optical part being optically coupled to the semiconductor optical device through the front wall of the optical module, and the front wall of the cap being made of a material allowing light of the semiconductor optical device to pass through the front wall.

Yet another aspect of the present invention relates to a method for fabricating an optical module. The method includes: preparing a single crystal semiconductor substrate having a first surface and a second surface, the single crystal semiconductor substrate including a first region, a second region, a third region, a fourth region and a fifth region arranged in order along a first reference plane in each of arrayed sections; forming a first mask on the first surface of the single crystal semiconductor substrate, the first mask having a first opening pattern and a second opening pattern; forming a first inner opening and a second inner opening in the first surface of the single crystal semiconductor substrate by etching with the first mask, the first inner opening being provided for a cavity, the second inner opening being provided for a wing, and the first inner opening and the second inner opening being associated with the first opening pattern and the second opening pattern, respectively; after forming the first inner opening and the second inner opening, forming a metal layer in the second inner opening of the single crystal semiconductor substrate, the metal layer being provided for a pad electrode and a conductor; forming a second mask with a third pattern on the second surface of the single crystal semiconductor substrate; forming an outer opening in the second surface of the single crystal semiconductor substrate by etching with the second mask, the outer opening being associated with the third pattern of the second mask, and the outer opening being provided for a front wall; preparing a bench product including a support having a principal surface with a first area and a second area in each of arrayed sections, an electrode disposed on the first area and the second area of the support, a semiconductor optical device disposed on the electrode on the first area of the support, and a lens disposed on the first area of the support; and after forming the first inner opening, the second inner opening and the outer opening, assembling the single crystal semiconductor substrate and the bench product to make an assembly such that the second area of the support of the bench product supports the single crystal semiconductor substrate, the electrode of the bench product being connected to the conductor of the single crystal semiconductor substrate in the assembly, the first surface of the single crystal semiconductor substrate being opposite to the second surface, the first region, the second region, the third region, the fourth region and the fifth region of the single crystal semiconductor substrate being arranged sequentially in a direction of a first axis, the outer opening having a bottom face and a first side face in the first region of the single crystal semiconductor substrate, the outer opening having a second side face in the second region of the single crystal semiconductor substrate, the first inner opening having a front face in the second region of the single crystal semiconductor substrate, the first inner opening having a bottom face in the third region and the fourth region of the single crystal semiconductor substrate, the first inner opening having a rear face in the fourth region of the single crystal semiconductor substrate, the second inner opening having a side face in the fourth region of the single crystal semiconductor substrate, the second inner opening having a bottom face in the fourth region and the fifth region of the single crystal semiconductor substrate, the front face of the first inner opening extending along a first inner reference plane intersecting with the first reference plane, the second side face of the outer opening extending along a first outer reference plane intersecting with the first reference plane, and the side face of the second inner opening extending along a second outer reference plane intersecting with the first reference plane.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIGS. 3A, 3B and 3C are schematic views each showing an optical device according to an embodiment of the present embodiment.

FIG. 5 shows cross sections, taken along a line corresponding to the cross section shown in FIG. 2, illustrating respective major steps in a method for making a bench product for a bench part according to the present embodiment.

FIG. 6 shows major steps in the method according to the present embodiment.

FIGS. 7A and 7B are schematic views showing a major step in the method according to the present embodiment.

FIGS. 8A and 8B are schematic views showing a major step in the method according to the present embodiment.

FIGS. 9A and 9B are schematic views showing a major step in the method according to the present embodiment.

FIGS. 10A and 10B are schematic views showing a major step in the method according to the present embodiment.

FIGS. 11A and 11B are schematic views showing a major step in the method according to the present embodiment.

FIGS. 12A and 12B are schematic views showing a major step in the method according to the present embodiment.

FIG. 14 shows cross sectional views, taken along a line corresponding to the cross section shown in FIG. 2, illustrating major steps in the method of making a cap product for a cap part.

DESCRIPTION OF EMBODIMENTS

Figure 1:
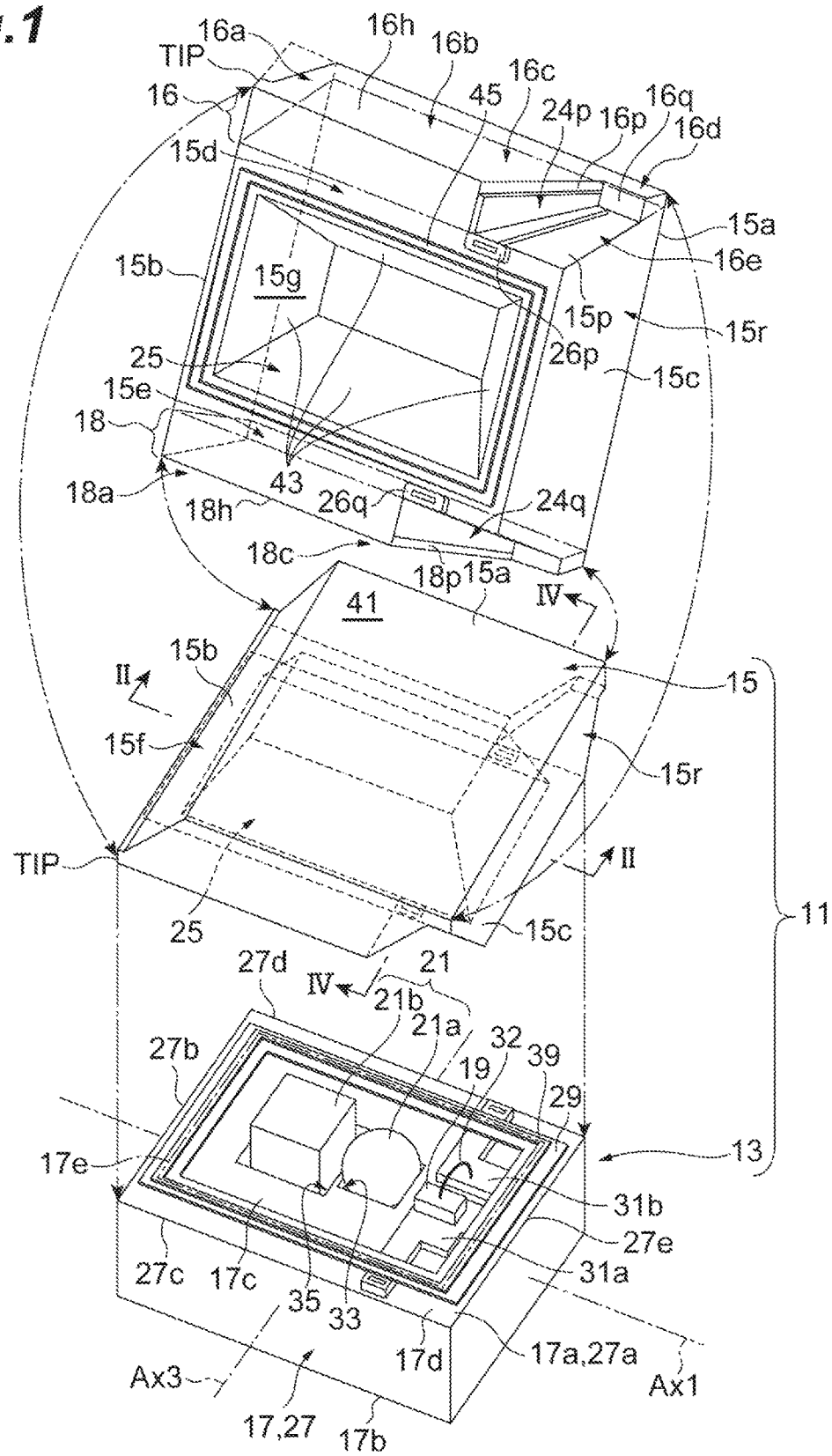
FIG. 1 is a schematic view showing an optical module according to the present embodiment.

The compact laser module disclosed in the above link comprises a substrate, an optical component provided on the substrate, and a reflecting mirror. The optical component includes an edge-emitting semiconductor laser, a lens, and an isolator, and the reflecting mirror which reflects light from the semiconductor laser to the substrate. The laser module is optically coupled to an external device, which receives the light emitted from the back side of the substrate. Electrical connection between the laser module and the external device is made via an electrode, disposed on the substrate, which is connected to the semiconductor laser.

Studies conducted by the inventor have found that an electrically connecting a laser module and an external device with each other via an electrode on the substrate may restrict the application scope of the optical module. Relaxing restrictions on such an electrical connection may expand the application scope of such an optical module.

It is an object of one aspect of the present invention to provide an optical module having a structure that can relax restrictions on the optical-coupling direction of the optical module in the mounting of the optical module. It is an object of another aspect of the present invention to provide an optical apparatus including the optical module. It is still another aspect of the present invention to provide a method of fabricating the optical module.

Specific embodiments according to the present above aspects are described below.

An optical module according to an embodiment includes: (a) a bench part including a bench, an electrode, a semiconductor optical device, and a lens, the bench having a principal surface with a first area and a second area, the electrode being disposed on the first area and the second area, the semiconductor optical device being disposed on the electrode in the first area, and the lens being supported by the first area; and (b) a cap disposed on the bench part. The cap includes a cap base, a pad electrode and a conductor; the cap includes a cavity, a ceiling, a front wall, a first side wall, a first wing, and a rear wall; the cavity contains the semiconductor optical device and the lens; the pad electrode is disposed on the first wing; and the conductor is disposed on the cap base and connected to the pad electrode. The second area of the bench surrounds the first area; the electrode on the second area is electrically connected to the conductor on the cap base. The semiconductor optical device, the lens and the front wall and the rear wall of the cap are arranged on a principal surface of the bench part along an optical reference plane extending in a direction of a first axis. The ceiling extends along a first reference plane; the front wall has a front outer face extending along a second reference plane; the second reference plane intersects with the first reference plane; the first wing is disposed on the first side wall; and the rear wall extends from the ceiling in a direction from the cap to the bench.

In the bench part of the above optical module, the electrode is provided on the first area and the second area, the semiconductor optical device is provided on the electrode in the first area, and the lens is supported by the first area. The electrode of the bench part extends on the principal surface of the bench (the first and second areas) to be electrically connected to a conductor on the cap base. The cap base includes the first wing on the first side wall mounting the pad electrode thereon. The pad electrode is disposed apart from the rear wall in the direction from the rear wall to the front wall. The optical module allows the first wing to separate the pad electrode from the rear wall, and accordingly can reduce constraints on the direction of optical coupling of the optical module in the mounting of the optical module.

In the optical module according to an embodiment, the cap base of the cap further includes a second side wall and a second wing, the second wing is disposed on the second side wall; the first side wall and the second side wall extend in a direction of the front wall to the rear wall; the front wall, the first side wall, the second side wall and the rear wall are disposed on the second area of the bench part; and the semiconductor optical device and the lens are hermetically sealed by the cap and the bench of the second area.

In the above optical module, the front wall, the first side wall, the second side wall and the rear wall of the cap are supported by the second area of the bench part, so that the assembly of the bench part and the cap can seal the semiconductor optical device and the lens. The second pad electrode is disposed on the second wing, and the location of the second pad electrode can also reduce constraints on the direction of optical coupling of the optical module in the mounting of the optical module.

In the optical module according to an embodiment, the bench includes a silicon base, and the silicon base of the bench has a principal surface with a recess for positioning the lens.

In the above optical module, the electrode and the positioning recesses can be formed by processing to provide the silicon base having them.

In the optical module according to an embodiment, the bench part includes an insulating layer disposed on the electrode in the second area; the electrode includes a first portion, a second portion and a third portion; the first portion of the electrode extends on the first area to be connected to the second portion; the insulating layer extends across the second portion of the electrode; the second portion of the electrode is connected to the third portion; and the third portion of the electrode is connected to the conductor.

The above optical module allows the sealing and the connection between the conductor and the electrode.

In the optical module according to an embodiment, the cap includes an insulating layer disposed on the second area of the bench part; the conductor includes a first portion, a second portion and a third portion; the first portion of the conductor connects the pad electrode to the second portion of the conductor; the insulating layer extends across the second portion of the conductor; the second portion of the conductor is connected to the third portion of the conductor; and the second portion of the conductor is connected to the third portion of the conductor.

The above optical module allows the sealing and the connection between the conductor and the electrode.

An optical apparatus according to an embodiment includes; (a) an optical module; and (b) an optical part. The optical module includes: a bench part including a bench, an electrode, a semiconductor optical device, and a lens, the bench having a principal surface with a first area and a second area, the electrode being disposed on the first area and the second area, the semiconductor optical device being disposed on the electrode in the first area, and the lens being supported by the first area; and a cap disposed on the bench part. In the optical module, the cap includes a cap base, a pad electrode and a conductor; the cap includes a cavity, a ceiling, a front wall, a first side wall, a first wing, and a rear wall; the cavity contains the semiconductor optical device and the lens; the pad electrode is disposed on the first wing; and the conductor is disposed on the cap base and connected to the pad electrode. In the optical module, the second area of the bench surrounds the first area; and the electrode on the second area is electrically connected to the conductor on the cap base. In the optical module, the semiconductor optical device, the lens and the front wall and the rear wall of the cap are arranged on a principal surface of the bench part along an optical reference plane extending in a direction of a first axis. In the optical module, the ceiling extends along a first reference plane; the front wall has a front outer face extending along a second reference plane; the second reference plane intersects with the first reference plane; the first wing is disposed on the first side wall; and the rear wall extends from the ceiling in a direction from the cap to the bench. In the optical module, the optical part supports the front wall of the optical module. In the optical module, the optical part is optically coupled to the semiconductor optical device through the front wall of the optical module, and the front wall of the cap is made of a material allowing light of the semiconductor optical device to pass through the front wall.

The optical apparatus can optically couple the optical module to an optical part through the front wall of the optical module, and the pad electrode disposed on the cap of the optical module can be used to make the electrical connection with the optical module.

In the optical apparatus according to an embodiment, the optical part includes a semiconductor integrated device having an optical grating coupler, and the optical grating coupler being optically coupled to the semiconductor optical device.

The optical apparatus can couple the optical integrated device to the optical module, and the optical module make electrical connection via the pad electrode(s) disposed on the first wing and/or the second wing.

A method for fabricating an optical module according to an embodiment includes: (a) preparing a single crystal semiconductor substrate having a first surface and a second surface, the single crystal semiconductor substrate including a first region, a second region, a third region, a fourth region and a fifth region arranged in order along a first reference plane in each of arrayed sections; (b) forming a first mask on the first surface of the single crystal semiconductor substrate, the first mask having a first opening pattern and a second opening pattern; (c) forming a first inner opening and a second inner opening in the first surface of the single crystal semiconductor substrate by etching with the first mask, the first inner opening being provided for a cavity, the second inner opening being provided for a wing, and the first inner opening and the second inner opening being associated with the first opening pattern and the second opening pattern, respectively; (d) after forming the first inner opening and the second inner opening, forming a metal layer in the second inner opening of the single crystal semiconductor substrate, the metal layer being provided for a pad electrode and a conductor; (f) forming a second mask with a third pattern on the second surface of the single crystal semiconductor substrate; (g) forming an outer opening in the second surface of the single crystal semiconductor substrate by etching with the second mask, the outer opening being associated with the third pattern of the second mask, and the outer opening being provided for a front wall; (h) preparing a bench product including a support having a principal surface with a first area and a second area in each of arrayed sections, an electrode disposed on the first area and the second area of the support, a semiconductor optical device disposed on the electrode on the first area of the support, and a lens disposed on the first area of the support; and (i) after forming the first inner opening, the second inner opening and the outer opening, assembling the single crystal semiconductor substrate and the bench product to make an assembly such that the second area of the support of the bench product supports the single crystal semiconductor substrate, the electrode of the bench product being connected to the conductor of the single crystal semiconductor substrate in the assembly. The first surface of the single crystal semiconductor substrate is opposite to the second surface. The first region, the second region, the third region, the fourth region and the fifth region of the single crystal semiconductor substrate is arranged sequentially in a direction of a first axis. The outer opening has a first side face in the second region of the single crystal semiconductor substrate. The outer opening has a bottom face and a second side face in the first region of the single crystal semiconductor substrate. The first inner opening has a front face in the second region of the single crystal semiconductor substrate. The first inner opening having a bottom face in the third region and the fourth region of the single crystal semiconductor substrate. The first inner opening has a rear face in the fourth region of the single crystal semiconductor substrate. The second inner opening has a side face in the fourth region of the single crystal semiconductor substrate. The second inner opening has a bottom face in the fourth region and the fifth region of the single crystal semiconductor substrate. The front face of the first inner opening extends along a first inner reference plane intersecting with the first reference plane; the first side face of the outer opening extends along a first outer reference plane intersecting with the first reference plane; and the side face of the second inner opening extends along a second outer reference plane intersecting with the first reference plane.

In the method of producing an optical module, the application of etching to the first surface forms the first inner opening for the cavity, which has a bottom face located in the third region of the single crystal semiconductor substrate, and the second inner opening for the wing, which has a side face with an edge located in the fourth region of the single crystal semiconductor substrate, and the application of etching to the second surface forms the outer opening for the front wall, which has a bottom face in the first region of the single crystal semiconductor substrate. Each of the first mask having the first opening pattern and the second mask having the third opening pattern is formed by patterning such that the front face of the first inner opening and the second side face of the outer opening are positioned in the second region of the single crystal semiconductor substrate. The first mask including the second opening pattern is formed by patterning such that the side face of the second inner opening is positioned in the fourth region of the single crystal semiconductor substrate. The first inner opening, the second inner opening and the outer opening for the cavity and the front wall and rear wall of the cap can be formed by the respective etching processes. The front face of the first inner opening, the second side face of the outer opening, and the side face of the second inner opening extend along the first inner reference plane, the first outer reference plane, and the second outer reference plane, respectively, and the first inner reference plane and the second outer reference plane each are inclined at an acute angle with respect to the first reference plane. The metal layer for the pad electrode and the conductor is formed in the second inner opening for the wing. The method can fabricate the optical module in which an electrode (the electrode on the bench part) on the bench product is connected to the metal layer in the second inner opening (the metal layer for the pad electrode and the conductor) on the cap product. The metal layer in the second inner opening can be used to form the pad electrode of the optical module on the wing.

The method according to an embodiment further includes: cutting the assembly in the first region of the single crystal semiconductor substrate to form an optical module part; and cutting the assembly in the fifth region of the single crystal semiconductor substrate to form an optical module.

In the method of producing the optical module, the optical module can be produced from the assembly by cutting it.

Teachings of the present invention can be readily understood by considering the following detailed description with reference to the accompanying drawings shown as examples. Referring to the accompanying drawings, embodiments of an optical module, a method of producing an optical module and an optical apparatus according to the present invention will be described below. To facilitate understanding, identical reference numerals have been used, where possible, to designate identical elements that are common to the figures.

Figure 2:
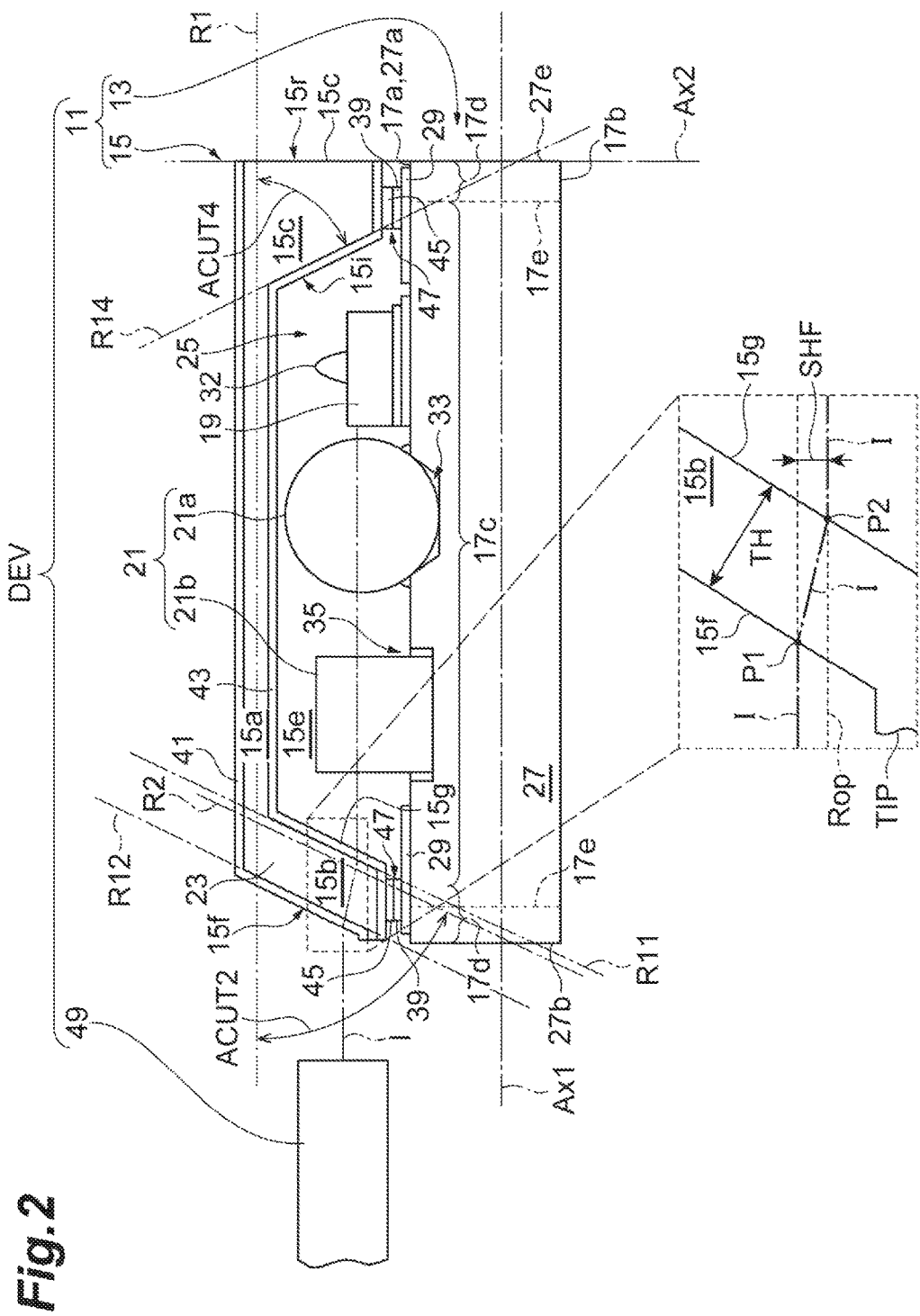
FIG. 2 schematically shows a longitudinal cross section taken along a II-II line shown in FIG. 1.

FIG. 1 is a schematic view showing an optical module according to the present embodiment. FIG. 2 is a longitudinal cross sectional view, taken along the line II-II shown in FIG. 1, schematically showing the optical module. An optical module 11 includes a bench part 13 and a cap 15. The cap 15 is disposed on the bench part 13, and has a cap base 23 made of, for example, silicon. The bench part 13 has a bench 17 and a semiconductor optical device 19, and if needed, may further include an optical component 21. The optical component 21 may include a lens 21a, and may further include an optical isolator 21b. The semiconductor optical device 19 can be, for example, a laser diode or a photodiode. The semiconductor optical device 19 can process light of, for example, 1.3 micrometer-band, 1.55 micrometer-band, or 1.49 micrometer-band. The bench 17 includes a base 27 made of, for example, silicon. The bench (specifically, the base 27) has a principal surface 17a (specifically, a principal surface 27a) and a back surface 17b, and the back surface 17b is opposite to the principal surface 17a. The principal surface 17a includes a first area 17c and a second area 17d. The semiconductor optical device 19 and the optical component 21 are disposed on the first area 17c. The second area 17d encircles the first area 17c. The optical component 21, such as a lens 21a, is supported by the first area 17c. Referring to FIG. 2, the optical module 11 is optically coupled to the optical part 49, which acts as an external device, such that the optical module 11 and the optical part 49 constitute the optical apparatus DEV.

The cap 15 includes a ceiling 15a, a front wall 15b, and a rear wall 15c. The cap 15 has a cavity 25 for accommodating the semiconductor optical device 19 and the optical component 21. In the present embodiment, the semiconductor optical device 19, the optical component 21, and the front wall 15b and the rear wall 15c of the cap 15 are arranged on the principal surface 17a of the bench 17 along an optical reference plane Rop extending in the direction of the first axis Ax1. The semiconductor optical device 19 is optically coupled to the front wall 15b of the cap 15 through the optical component 21, such as, a lens 21a. The light beam I associated with the semiconductor optical device 19 (the light beam that the semiconductor optical device 19 emits or receives) can pass through the front wall 15b of the cap 15. More specifically, as shown in FIG. 2, the ceiling 15a extends along the first reference plane R1. The front wall 15b extends from the ceiling 15a along the second reference plane R2. The second reference surface R2 is inclined with respect to the first reference plane R1 at an angle ACUT2. The front inner face 15g of the front wall 15b has a portion extending along a first inner reference plane R11, which is inclined with respect to the first reference plane R1, and the front outer face 15f of the front wall 15b has a portion extending along a first outer reference plane R12, which is inclined with respect to the first reference plane R1 and the optical reference plane Rop. In a preferred embodiment, the inclination angle of the first inner reference plane R11 can be an angle ACUT2, and the inclination angle of the first outer reference plane R12 can be an angle ACUT2. The angle ACUT2 is preferably less than 90 degrees and greater than zero. Specifically, the outer and inner faces of the cap base 23 that correspond to the front outer face 15f and the front inner face 15g of the front wall 15b, respectively, are provided with a (111) plane of the base made of silicon. In the above module, the angle ACUT2 can be, for example 54.7 degrees, which is defined as an angle between the silicon (111) plane and the silicon (001) plane. In the present embodiment, the optical reference plane Rop intersects with an axis normal to the principal surface 17a of the bench 17. The optical reference plane Rop to which the normal of the principal surface 17a of the bench 17 is perpendicular forms respective acute angles with the second reference plane R2, the first inner reference plane R11 and the first outer reference plane R12.

The cap 15 has a first side wall 15d and a second side wall 15e. Specifically, the cap 15 may include a cap base 23 made of silicon. The cap base 23 provides the ceiling 15a, the front wall 15b, the rear wall 15c, the first side wall 15d, the first wing 16, the second side wall 15e, and the second wing 18 with respective base portions. The front wall 15b, the rear wall 15c, the first side wall 15d, and the second side wall 15e is disposed on the second area 17d of the bench part 13. The first wing 16 includes a base portion of the first side wall 15d, and the second wing 18 includes a base portion of the second side wall 15e. The cavity 25 is formed by the ceiling 15a, the front wall 15b, the rear wall 15c, the first side wall 15d, and the second side wall 15e. The first side wall 15d and the second side wall 15e extend in the direction from the front wall 15b to the rear wall 15c.

FIGS. 3A, 3B and 3C are schematic drawings each showing an exemplary optical device including the optical module according to the present embodiment. Specifically, FIG. 3A is a longitudinal cross sectional view, taken along the line II-II shown in FIG. 1 showing the appearance of the optical module mounted to form an optical apparatus. FIGS. 3B and 3C each show a rear view of the optical module. As shown in FIGS. 1 and 3A, 3B and 3C, the first wing 16 has a front end 16a and a rear end 16c, which are located on the first side wall 15d. The front end 16a and the rear end 16c are arranged in the direction of the first axis Ax1. The rear end 16c is disposed apart from the rear end face 15r of the rear wall 15c in the direction from the rear wall 15c to the front wall 15b. The front end 16a is, in the present embodiment, disposed at the front wall 15b, but is not limited thereto. The first wing 16 is disposed on the first side wall 15d, so that the rear end 16c of the first wing 16 forms a difference in level with respect to the side 15p of the first side wall 15d. This level difference can provide the rear end 16c of the first wing 16 with a rear end face 16p. The first wing 16 may further comprise an intermediate portion 16b, which is disposed between the front end 16a and the rear end 16c. The rear end face 16p of the rear end 16c extends along the second outer reference plane R13, which is inclined with respect to the first reference plane R1.

The first wing 16 has an overhanging portion 16d projecting from the first side wall 15d in the direction along which the first reference plane R1 extends. The overhanging portion 16d extends in the direction of the first axis Ax1 from the rear end 16c of the first wing 16 to the rear end face 15r of the rear wall 15c along the edge of the ceiling 15a of the cap base 23. The overhanging portion 16d can enhance the mechanical strength of the first wing 16. The overhanging portion 16d of the first wing 16 forms a difference in level with respect to the side face 15p of the first side wall 15d. The overhanging portion 16d has a lower face 16q so as to provide the difference in level. The lower face 16q of the overhanging portion 16d and the rear end face 16p of the rear end portion 16c are connected to the side face 15p of the first side wall 15d, and the side face 15p is connected to the rear end face 15r of the rear wall 15c.

The rear wall 15c extends from the ceiling 15a in the direction from the cap 15 to the bench part 13. The rear end face 15r of the rear wall 15c extends along the direction of the second axis Ax2 intersecting with the first axis Ax1, and the inner rear face 15i of the rear wall 15c extending along the second inner reference plane R14 which is inclined with respect to the first reference plane R1 and the optical reference plane Rop. The second inner reference plane R14 is inclined at an angle ACUT4 with respect to the first reference plane R1. Preferably, the angle ACUT4 is larger than zero and smaller than 90 degrees. Specifically, the inner rear face 15i of the rear wall 15c can be provided with the (111) plane of silicon of the base.

The front wall 15b of the cap 15, the semiconductor optical device 19 and the optical component 21 are arranged on the principal surface 17a along the optical reference plane Rop (for example, a plane which is perpendicular to the normal of the principal surface 17a of the bench 17). In the present embodiment, the front wall 15b of the cap 15 is inclined with the optical reference plane Rop. In the optical module having the front wall 15b inclined at an angle, in particular, an acute angle, not to be perpendicular to the front wall 15b, this inclination allows the front wall 15b to refract the light beam I of the semiconductor optical device 19 at the incident and emission faces of the front wall 15b twice, and these refractions change the traveling directions of the light beam I, so that the incident and refracted light beams I propagate at different levels one of which deviates from the optical reference plane Rop.

FIGS. 3A, 3B and 3C show an optical device DEV. The optical device DEV comprises an optical module 11, which may be described as any one of the embodiments, and an optical part 49 which supports the front wall 15b of the optical module 11. The optical part 49 is optically coupled to the semiconductor optical device 19 through the front wall 15b of the optical module 11, and the optical beam I associated with the semiconductor optical device 19 can pass through the front wall 15b of the cap 15. The optical device DEV allows the optical module 11 to be optically coupled to the optical part 49 via the front wall 15b of the optical module 11. The front wall 15b of the optical module 11 is supported by the principal surface 49a of the optical part 49 via a fixing member 50, which includes the refractive index adjusting material and/or adhesive.

As shown in FIG. 3A, the inclination angle of the second outer reference plane R13 may be an angle ACUT3. The angle ACUT3 preferably ranges from 30 to 70 degrees. Specifically, the rear end face 16p of the rear end 16c can be provided with the (111) plane of silicon material of the base, the lower face 16q of the overhanging portion 16d may be provided with the (001) plane of silicon. In this arrangement, the angle ACUT3 is formed between the first reference plane R1 and the rear end face 16p of the rear end 16c. The angle ACUT3 may be, for example, 54.7 degrees, which corresponds to the angle between the silicon (111) plane and the silicon (001) plane. The angle between the front wall 15b and the rear end face 16p can range, for example, from zero to 20 degrees.

As shown in FIGS. 3B and 3C, the side face 15*p* of the first side wall 15*d* extends along a third outer reference plane R15, which is inclined in a rotative direction from the first reference plane R1 to the bench part 13 with respect to the first reference plane R1. The inclination angle of the third outer reference plane R15 may be an angle ACUT5. Preferably, the angle ACUT5 ranges from 30 to 70 degrees. Specifically, the side face 15*p* of the first side wall 15*d* may be provided with the (111) plane of silicon of the base. The angle ACUT5 is formed between the first reference plane R1 and the side 15*p* of the first side wall 15*d*. The angle ACUT5 may be, for example, 54.7 degrees, which corresponds to the angle between the silicon (111) plane and the silicon (001) plane.

A first pad electrode 24*p* may be disposed on the rear end 16*c* of the first wing 16. In the present embodiment, the first pad electrode 24*p* is located on the rear end face 16*p* of the rear end 16*c*. In the optical module the front wall 15*b* of which is supported on the principal surface 49*a* of the optical part 49, the pad electrode can be oriented substantially parallel to the principal surface 49*a* of the optical part 49. This arrangement of the optical module and the optical part 49 allows a bonder to not only perform wire bonding to an electrode on the principal surface 49*a* of the optical part 49 but also easily perform wire bonding to the pad electrode on the wing, and has an advantage of easily making electrical connection between the pad electrode of the optical module and the electrode on the principal surface 49*a* of the optical part 49. The two differences in level associated with the rear end 16*c* and the overhanging portion 16*d* of the first wing 16 can provide a path for a bonding wire connecting the first pad electrode 24*p* on the rear end 16*c*, and this path makes it easy to form electrical connection to the first pad electrode 24*p* on the rear end 16*c*. The first pad electrode 24*p* is electrically connected to the first conductor 26*p* disposed on the first side wall 15*d* and/or the first wing 16.

In the optical module 11 according to the present embodiment, referring to FIGS. 1 and 3A to 3C, the second wing 18 is provided on the second side wall 15*e*. The second wing 18 has a rear end 18*c*, and the second pad electrode 24*q* is disposed on the rear end face 18*p*. The second pad electrode 24*q* is electrically connected to the second conductor 26*q* extending on the second side wall 15*e* and/or the second wing 18. The second wing 18 has a front end 18*a*, which is disposed at the front wall 15*b* in the present embodiment.

In the above optical module 11, the bench part 13 may include electrodes 31*a* and 31*b*, which are connected to the semiconductor optical device 19 and provided on the first area 17*c* and the second area 17*d*. The electrodes 31*a* and 31*b* extend across the boundary 17*e* between the first area 17*c* and the second area 17*d* in the direction of the third axis Ax3, and these extensions of the electrodes 31*a* and 31*b* can make it possible to provide the semiconductor optical device 19, which is mounted on the first area 17*c*, with electrical connection on the second area 17*d*. The electrodes 31*a* and 31*b* on the second area 17*d* of the bench 17 are connected to the first conductor 26*p* and the second conductor 26*q* of the cap 15, respectively, which are connected to the first pad electrode 24*p* and the second pad electrode 24*q* of the cap 15, respectively. In the present embodiment, the electrodes 31*a* and 31*b* extend across the boundary 17*e*, for example, in the direction of the third axis Ax3. The extensions of the electrodes 31*a* and 31*b* makes it possible to obtain an electrical connection between the electrodes disposed outside the cavity 25 and the semiconductor optical device 19 inside the cavity 25. If necessary, the electrodes 31*a* and 31*b* may run across the boundary 17*e* in a direction different from that of the third axis Ax3.

The bench part 13 further includes the semiconductor optical device 19 provided on the electrode 31*a* in the first area 17*c*, and the lens 21*a* supported by the first area 17*c*. The electrodes 31*a* and 31*b* of the bench part 13 extend along the principal surface 17*a* (the first area 17*c* and the second area 17*d*) of the bench 17, so that orientation of the surface 17*a* of the bench 17 and the orientation of the top surfaces of the electrodes 31*a* and 31*b* on the surface 17*a* are associated with the direction of the optical coupling of the optical module 11 mounted.

As shown in FIGS. 1 and 3A to 3C, the optical module 11 of the present embodiment uses the first pad electrode 24*p* and the second pad electrode 24*q*, which are disposed on the first wing 16 and the second wing 18, respectively, to make electrical connection to the optical part 49. The electrical connections between the first pad electrode 24*p* and the optical component 49 and between the second pad electrode 24*q* and the optical component 49 are made by, for example, the first bonding wire 48*a* and the second bonding wires 48*b*, respectively. As shown in FIGS. 3B and 3C, the first bonding wire 48*a* is connected to the first pad electrode 24*p* on the rear end face 16*p*, and the second bonding wire 48*b* is connected to the second pad 24*q* on the rear end face 18*p*. In the present embodiment, the first wing 16 and the second wing 18 are provided in the first side wall 15*d* and the second side wall 15*e*, respectively, so that the first pad electrode 24*p* and the second pad electrode 24*q* can be located far from the rear wall 15*c* of the optical module 11 in the direction from the rear wall 15*c* to the front wall 15*b*. As shown in FIG. 3A, the first wing 16 or the second wing 18 may be distant from the rear wall 15*c* of the optical module 11 by the distance 24*h*. The first bonding wire 48*a* and the second bonding wire 48*b* start to extend from the first pad electrode 24*p* on the first wing 16 and the second pad electrode 24*q* on the second wing 18 and extend to the optical part 49 so as to draw a curve. Desirably, the height 48*h* of the bonding wire is lower than the height 13*h* of the rear wall 15*c*, where the height 48*h* is defined as a distance from the principal surface 49*a* of the optical part 49 to the maximum height of the bonding wire, and the height 13*h* is defined as a distance from the principal surface 49*a* of the optical part 49 to the rear end face 15*r* of the rear wall 15*c*. The rear wall 15*c* extends along the fourth outer reference plane R16 intersecting with the first reference plane R1. The optical module 11 alleviates restrictions on the direction of the optical coupling of the optical module 11 in the mounting of the optical module 11 by providing the first pad electrode 24*p* on the first wing 16 and the second pad electrode 24*q* on the second wing 18. The first bonding wire 48*a* and the second bonding wire 48*b* can connect the first pad electrode 24*p* and the second pad electrode 24*q* to the optical part 49, respectively, so that the optical module 11 can prevent the bonding wire height 48*h* from exceeding the height 13*h* of the rear wall 15*c*.

FIGS. 3B and 3C each illustrate the configuration of a bonding wire connected to the pad electrode. In the bench part 13 having a width HC1 less than a distance between the lower ends of the cap 15, specifically, a width HC1 lower than a distance HC2 of between the lower ends of the first side wall 15*d* and the second side wall 15*e*, the first bonding wire 48*a* and the second bonding wire 48*b*, as illustrated in FIG. 3B, may extend along the side faces of the first side wall 15*d* and the second side wall 15*e*, respectively. In the bench part 13 having a width HC1 less than or not more than a width HC2 between lower ends of the first side wall 15*d* and the second side wall 15*e*, the first bonding wire 48*a* and the second bonding wire 48b, as illustrated in FIG. 3C, may extend outward in respective directions of axes intersecting with the side faces of the first and the second side walls 15d and 15e. Alternatively, the first bonding wire 48a and the second bonding wire 48b may extend, for example, in a direction different from these exemplary directions shown in FIGS. 3B and 3C. The first bonding wire 48a and the second bonding wire 48b are protected by the overhanging portion 16d and the overhanging portion 18d, respectively.

As shown in FIG. 2, in the optical module 11 having the front wall 15b inclined with respect to the optical reference plane Rop, the front wall 15b of the cap 15, the semiconductor optical device 19, and the lens 21a are arranged along the optical reference plane Rop, and this arrangement allows the semiconductor optical device 19 to optically couple to the front wall 15b of the cap 15 through the optical component 21, such as the lens 21a. Further, the front wall 15b of the cap 15 is transparent to the light beam I to/from the semiconductor optical device 19, and the light beam I which passes therethrough is refracted at the front inner and outer faces 15f and 15g of the front wall 15b that extends along the second reference plane R2. The second reference plane R2 for the front wall 15b is inclined at an angle of greater than zero degrees with respect to the first reference plane R1 and the optical reference plane Rop. Specifically, the front inner face 15g of the front wall 15b has a portion extending along the first inner reference plane R11, which is inclined at an acute angle with respect to the first reference surface R1 and the optical reference plane Rop, and the front outer face 15f of the front wall 15b may have a portion extending along the first outer reference plane R12, which is inclined at an acute angle with respect to the first reference plane R1 and the optical reference plane Rop. In the front wall 15b in which the angle ACUT2 is less than 90 degrees, as shown in FIG. 2, the inclination of the front wall 15b makes the point P2 of the intersection of the front inner face 15g of the front wall 15b with the optical axis of the light beam I higher toward the point P1 of the intersection of the front outer face 15f of the front wall 15b with the optical axis of the light beam I in the direction normal to the principal surface 17a of the bench 17. The difference in height (the shift SHF) makes it possible to separate the intersecting position P1 from the tip TIP of the front wall 15b (e.g. the cut end) in the direction of the normal direction of the principal surface 17a of the bench 17. Although an optically non-uniform shape is likely to be formed at the tip TIP of the front wall 15b in the production of the cap 15, the inclination of the front wall 15b can prevent the non-uniform shape of the front wall 15b from disturbing the light beam I, in passing therethrough, to/from the semiconductor optical device 19.

Further, the end of an inclined portion of the outer front face 15f is more separated from the principal surface 17a of the bench 17 than that of the inner front face 15g of the front wall 15b. In contrast, the lower end of an inclined portion of the inner front face 15g of the front wall 15b is closer to the principal surface 17a of the bench 17 than the lower end of the outer front face 15f. The difference in position between these ends (the difference in height between the ends) is associated with the method of making the cap 15, which will be described below. The light beam I of the semiconductor optical device 19 propagates through the optical component 21 mounted on the principal surface 17a of the bench 17, so that the actual optical path of the light beam I is near the principal surface 17a of the bench 17. The front wall 15b having a desired thickness TH and a desired slope allows the incidence and exit levels of the light passing through the front wall 15b to become different from each other because of the refractions of light passing therethrough. The thickness TH of the front wall 15b can be, for example, about 100 micrometers, and may range for example, from 50 to 300 micrometers.

The optical part 49 may include a semiconductor integrated device, such as a silicon photonics devices, and the optical part 49 (for example, a semiconductor integrated device) includes an optical coupling device, such as a grating coupler 49cp, which is to be optically coupled to the semiconductor optical device 19. The slope of the front wall 15b (15f and 15g) of the optical module 11 with respect to the optical reference plane Rop allows the angle ACP between the optical reference plane Rop and the normal axis NX of the principal surface 49a to match with a coupling angle of the optical coupling device, for example, the grating coupler 49cp in the semiconductor integrated device. The angle ACP for the grating coupler 49cp is, for example, in the range of 5 to 15 degrees, and the present embodiment is not limited thereto. The angle ACP specifically depends upon the inclination of the front wall 15b of the cap 15, and the tilt angle of the slope of the front wall 15b depends upon crystal plane orientation of a principal surface of semiconductor to be used to form the cap base 23 of the cap 15.

As shown in FIGS. 1 and 2, the semiconductor optical device 19 and the lens 21a are sealed with the cap 15 on the second area 17d of the bench part 13. The bench part 13 supports the front wall 15b, the first side wall 15d, the second side wall 15e and the rear wall 15c of the cap 15 on the second area 17d so as to seal the semiconductor optical device 19 and the lens 21a.

In the optical module 11, the electrodes 31a and 31b extend on the principal surface 27a of the base 27 from the first area 17c to the second area 17d across the boundary 17e between the first area 17c and the second area 17d in the direction of the third axis Ax3. The bench part 13 is provided with an insulating film 29 for insulation and hermetic sealing, and the insulating film 29 is provided on the electrodes 31a and 31b in the second area 17d. Specifically, the insulating film 29 extends on a closed line inside the principal surface 27a of the base 27 along a front edge 27b, a first side edge 27c, a second side edge 27d, and a rear edge 27e of the principal surface 27a to form a stripe-shaped layer. In the present embodiment, the stripe-shaped insulating film 29 extends on the boundary 17e between the first area 17c and the second area 17d. The insulating film 29 can be, for example, silicon-based inorganic insulating film, such as, $SiO_2$, SiN, SiON or other materials. On the insulating film 29, a lower metal layer 39 for hermetic sealing is provided. The lower metal layer 39 also extends along the closed line on the principal surface 27a of the base 27 to form a stripe. The lower metal layer 39 is provided on the insulating film 29, and the insulating film 29 is provided over the electrodes 31a and 31b so as to insulate the electrodes 31a and 31b from the lower metal layer 39.

The outer surface of the cap base 23 of the ceiling 15a, and the outer surface of the cap base 23 of the front wall 15b are covered with an outer protective film 41 except for the front end TIP of the front wall 15b of the cap 15, the outer side face of the rear wall 15c, the outer face of the first side wall 15d, and the outer side face of the second side wall 15e (which are formed by cutting). In addition, the inner face of the cap base 23 of the ceiling 15a (the ceiling face of the cavity), the inner face of the cap base 23 of the front wall 15b (the front face of the cavity), the lower end face of the cap base 23 of the front wall 15b, the inner face of the cap base 23 of the rear wall 15c (the rear face of the cavity) and the lower end face of the cap base 23 of the rear wall 15c, the inner face of the cap base 23 of the first side wall 15d (the side face of the cavity), and the inner face of the cap base 23 of the second side wall 15e (the other side face of the cavity) are covered with an inner protective film 43. The outer protective layer 41 and the inner protective layer 43 preferably each comprise a dielectric film, which can act as an antireflection film on the silicon base. These dielectric films can reduce optical loss caused by the front wall 15b in the exit/incidence of light passing through the front wall 15b.

The cap 15 is disposed on the inner protective film 43, and includes an upper metal layer 45 for hermetic sealing. The upper metal layer 45 is disposed on the inner protective film 43, which covers the lower end face of the cap base 23 of the front wall 15b, the lower end face of the cap base 23 of the rear wall 15c, the lower end face of the cap base 23 of the first side wall 15d, and the lower end face of the cap base 23 of the second side wall 15e. The upper metal layer 45 may have a strip-shaped pattern, like the lower metal layer 39 of the bench part 13, which extends along a closed line on the above-mentioned lower end faces of the cap base 23.

If necessary, the lower metal layer 39 of the bench part 13 and the upper metal layer 45 of the cap 15 are joined together with a metal body 47, such as a soldering material, so that the cavity 25 formed by the bench part 13 and the cap 15 is air-tightly sealed in the assembly. In the optical module 11, the rearmost end 27e of the bench part 13 is positioned at the same position as that of the rearmost end of the rear wall 15c of the cap 15, alternatively may be disposed at a position separated forward from the rearmost end of the rear wall 15c of the cap 15 in the direction from the rearmost end 27e to the front wall 27b.

Figure 4A:
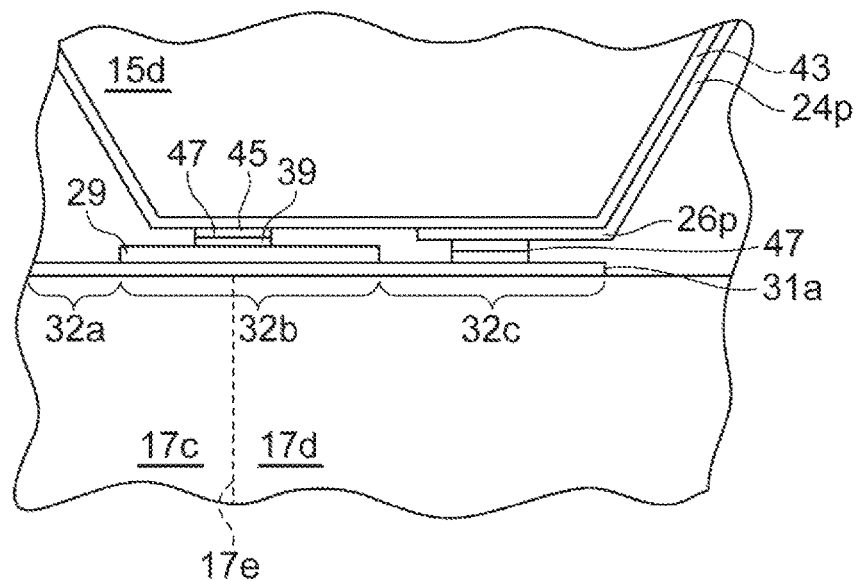
FIGS. 4A and 4B are schematic views each showing a structure for hermetic sealing and electrical connection in the vicinity of the first side wall.
Figure 4B:
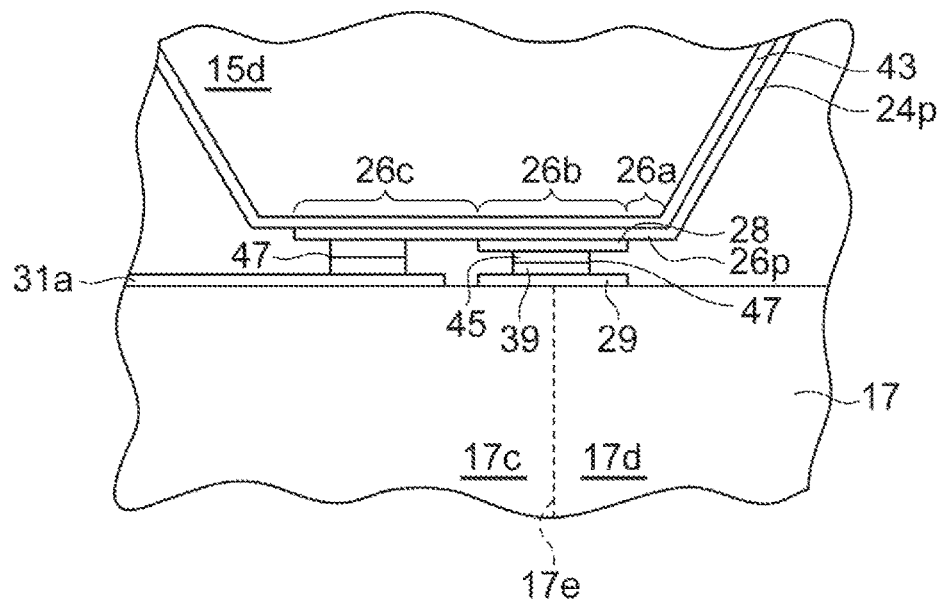

FIGS. 4A and 4B are longitudinal cross sectional views, taken along the line IV-IV shown in FIG. 1, each showing a structure for hermetic sealing and electrical connection in the vicinity of the first side wall. FIG. 4A is a schematic drawing showing an interconnection around the first wing 16 of the optical module 11 shown in FIGS. 1 and 2. The electrode 31a includes a first portion 32a, a second portion 32b, and a third portion 32c. The insulating layer 29 extending across the upper second portion 32b can isolate the lower metal layer 39 for sealing from the electrode 31a. Specifically, the first portion 32a extends on the first area 17c to be connected to the second portion 32b. The second portion 32b is connected to the third portion 32c. The third portion 32c is connected to the first conductor 26p of the cap 15 on the second area 17d. This optical module 11 enables both the sealing and the connection between the electrode 31a, and the first pad electrode 24p and the first conductor 26p. Hermetic sealing and electrical connection in the vicinity of the second side wall 15e may be provided by a structure similar to that shown in FIG. 4A as well.

FIG. 4B shows another interconnecting structure for the optical module 11 shown in FIGS. 1 and 2. Each of the conductors 26p of the cap 15 includes a first portion 26a, a second portion 26b, and a third portion 26c. The cap 15 is provided with an insulating layer 28, and the insulating layer 28 has the same role as the insulating layer 29 of the bench part 13. The insulating layer 28 extends on the boundary 17e between the first area 17c and the second area 17d of the bench part 13, and is provided on the lower end face of the first side wall 15d. The insulating layer 28 extends across the second portion 26b of the conductor 26p to isolate the upper metal layer 45 for sealing from the conductor 26p. The first portion 26a of the conductor 26p connects the pad electrode 24p to the second portion 26b. The second portion 26b and the third portion 26c of the conductor 26p are connected to each other. The third portion 26c is connected to the electrode 31a on the first area 17c. The present optical module 11 can provide not only the respective connection between the electrodes 31a and 31b and the pad electrodes 24 and 26 but also the sealing. Hermetic sealing and electrical connection in the vicinity of the second side wall 15e may be provided by a structure similar to that shown in FIG. 4B as well.

Referring again to FIGS. 1 and 2, the bench 17 includes a base 27 made of silicon. The principal surface 17a of the bench 17 (specifically, the base 27) has a first recess 33 for positioning the lens 21a, such as ball lens, and a second recess 35 for receiving the optical isolator 21b therein. The first recess 33 and the second recess 35 are produced by processing a silicon base 27.

The lens 21a and the optical isolator 21b are secured to the bench 17 by an adhesive member, such as, an epoxy-based adhesive. The semiconductor optical device 19 is bonded to the electrode 31a of the bench 17 by, for example, a soldering material (AuSn solder). The semiconductor optical device 19 is connected to the electrode 31b through the connecting conductors 32, such as a bonding wire. The lens 21a is used for condensing or collimating a light beam to/from the semiconductor optical device 19.

In the cap base 23 made of single crystal silicon, the inner face of the cap base 23 of the front wall 15b, the inner face of the base 23 of the rear wall 15c, the inner face of the cap base 23 of the first side wall 15d, the inner face of the cap base 23 of the second side wall 15e may include the (111) plane of silicon. This structure can be fabricated using a silicon substrate having a principal surface with the (001) plane of silicon. The optical module 11 can be optically connected to an external device through the side face of the cap 15 rather than the back surface of the substrate.

The present embodiment as described above shows that the optical module 11 can reduce the constraints on the orientation of the optical module 11 in optical coupling thereof.

Subsequently, major steps in a method for producing an optical module 11 will be described below. For ease of understanding, where possible, the reference numerals in the description of the optical module 11 made with reference to FIGS. 1 to 3A, 3B, 3C, 4A and 4B will be referred to in the subsequent description of the producing method. With reference to FIGS. 5, 6, 7A, 8A, 9A, 10A, 11A and 13A each showing a cross section corresponding to that in FIG. 2, and FIGS. 7B, 8B, 9B, 10B, 11B and 13B each showing a plan view, major steps of preparing the bench product for the bench part 13 will be described. As can be seen from the subsequent description, an example of the preparation is to perform the production of a bench product.

In step S101, as shown in FIG. 5, the silicon wafer 51 is prepared as a single crystal semiconductor substrate. The silicon wafer 51 has a principal surface 51a and a back surface 51b, and the principal surface 51a may comprise, for example, the (001) plane of silicon. The silicon wafer 51 has a size (e.g., 6 inches), which can include an array of sections (to which the subsequent processes are applied to form a substrate product for the bench 17), and is, for example, 725 micrometer thick. In each section in the array, the principal surface 51a has a first area 51c, a second area 51d, and a third area 51e. The second area 51d and the third area 51e include a cutting margin for cutting. As shown in part (a) of FIG. 5, a first insulating film 53, such as silicon oxide film, is formed on the principal surface 51a of the silicon wafer 51. In the present embodiment, the rear surface 51b of the silicon wafer 51 is not covered with an insulating film, and if needed, an insulating film can be formed on the back surface 51b.

In step S102, a first recess 33 for positioning the lens 21a is formed in the first area 51c of each section of the silicon wafer 51 in the present embodiment. As shown in part (b) of FIG. 5, a first mask 53a which defines a first recess 33 for positioning the lens 21a is produced from the first insulating film 53 using photolithography. As shown part (c) of FIG. 5, the silicon single crystal appearing at the first opening 53b of the first mask 53a is wet-etched with the first mask 53a using a KOH solution as etchant to form a first recess 33 in the first area 51c. The shape of the first opening 53b is, for example, a rectangular or square due to the four-fold symmetry of silicon, and in the present embodiment, is a square which includes a pair of sides extending in the <110> axial direction of the silicon crystal and another pair of sides extending in the <11-0> axial direction. After the first recess 33 has been formed, as shown in part (d) of FIG. 5, the first recess mask 53a is removed therefrom.

In step S103, after the removal of the first mask 53a, as shown in part (a) of FIG. 6, a second insulating film 55, such as silicon oxide film, is formed on the principal surface 51a of the silicon wafer 51. In order to avoid etching of the back surface 51b of the silicon wafer 51, an insulating film, such as silicon oxide film, may be formed on the back surface 51b.

In step S104, a second recess 35 for receiving the optical isolator 21b therein in the present embodiment is formed in the first area 51c in each section of the silicon wafer 51. As shown in part (b) of FIG. 6, a second mask 55a which defines the second recess 35 for positioning the optical isolator 21b is produced from the second insulating film 55 using photolithography. As shown in part (c) of FIG. 6, the silicon single crystal appearing at the second opening 55b of the second mask 55a is dry-etched with the second mask 55a to form a second recess 35 next to the first recess 33. The shape of the second opening 55b may be, for example, a square, rectangular or other shapes, and in the present embodiment, is a square with a pair of sides extending in the <110> axial direction of the silicon crystal and another pair of sides extending in the <11-0> axial direction. After the second recess 35 has been formed in the first area 51c, as shown in part (d) of FIG. 5, the second mask 55a is removed to produce a support from the single crystal silicon substrate.

In step S105, as shown in FIGS. 7A and 7B, electrodes 31a and 31b are formed in the first area 51c. In the present embodiment, the electrode 31a and 31b are formed by a lift-off method. More specifically, a sacrificial layer having a pattern for lift-off is formed on the wafer, and a metal film is grown thereon by vapor deposition. The sacrificial layer may be a resist film, and the metal film comprises, for example, a Ti/Pt/Au (100 nm/200 nm/500 nm). After the deposition of the metal film, the silicon wafer 51 is immersed in a remover solution for the sacrificial layer to perform the lift-off of the metal film.

In step S106, an insulating layer 29 for insulation and hermetic sealing is formed. As shown in FIGS. 8A and 8B, an insulating film 57 (e.g., $SiO_2$ with a thickness of 500 nm) for the insulating layer 29 is grown by chemical vapor deposition (CVD) method. A sealing mask 59 having a sealing pattern is formed on the insulating film 57 by photolithography. In FIGS. 8A and 8B, the sealing mask 59 is depicted along with the first opening 59a and the second opening 59b, and the sealing mask 59, as shown in the cross section, has a stripe shape, which corresponds to that of the insulating layer 29, extending on a closed loop for sealing in each section.

In step S107, as shown in FIGS. 9A and 9B, the insulating film 57 is subjected to dry etching with the sealing mask 59 using an etchant ($CF_4$) to form the insulation layer 29 on the first area, and after the etching, the sealing mask 59 is removed by a remover solution.

In step S108, as shown in FIGS. 10A and 10B, a sacrificial layer 60 having a pattern for a sealing member is formed. The sacrificial layer 60 can be a resist film.

In step S109, as shown in FIGS. 11A and 11B, a sealing member is formed. The sealing member may be made of, for example, a metal member, an organic resin or other materials. In the present embodiment, the sealing member including a metallic material can be formed. Specifically, the lower metal layer 39 is formed by a lift-off method. A metal film is grown on the sacrificial layer by vapor deposition. The metal film thus grown may be made of a Ti/Pt/Au (100 nm/200 nm/50 nm). The silicon wafer 51 is immersed in a remover solution for the sacrificial layer to perform the lift-off of the metal film, thereby forming a patterned metal film, for example, the lower metal layer 39 on the insulating layer 29 for each section in the present embodiment.

In step S110, the die bonding of the semiconductor optical device 19 is carried out. As shown in FIGS. 12A and 12B, a patterned solder 61 is formed for die bonding of the semiconductor optical device 19 by a lift-off method. More specifically, a sacrificial layer with a pattern for lift-off is formed on the silicon wafer 51, and a metal film is grown thereon by vapor deposition. The sacrificial layer may be a resist film, and the metal film, for example, a AuSn solder with a thickness of 2 micrometers is deposited thereon. After the metal film has been formed on the silicon wafer 51, the silicon wafer 51 is immersed in a remover solution to lift off the metal film from the sacrificial layer. The next step is, as shown in FIGS. 12A and 12B, to perform the die bonding of the semiconductor optical device 19. Specifically, a laser diode is positioned on the fixing solder 61. The work temperature for soldering is, for example, 330 degrees Celsius. After the die bonding of the semiconductor optical device 19 has been performed, the upper electrode of the semiconductor optical device 19 is connected to the electrode 31b with a gold wire 63 by wiring.

Figure 13A:
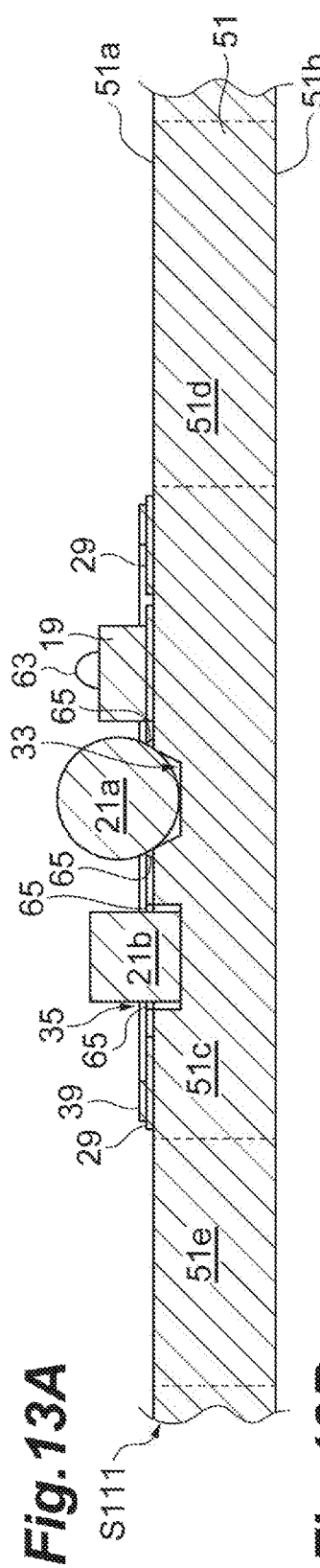
FIGS. 13A and 13B are schematic views showing a major step in the method according to the present embodiment.
Figure 13B:
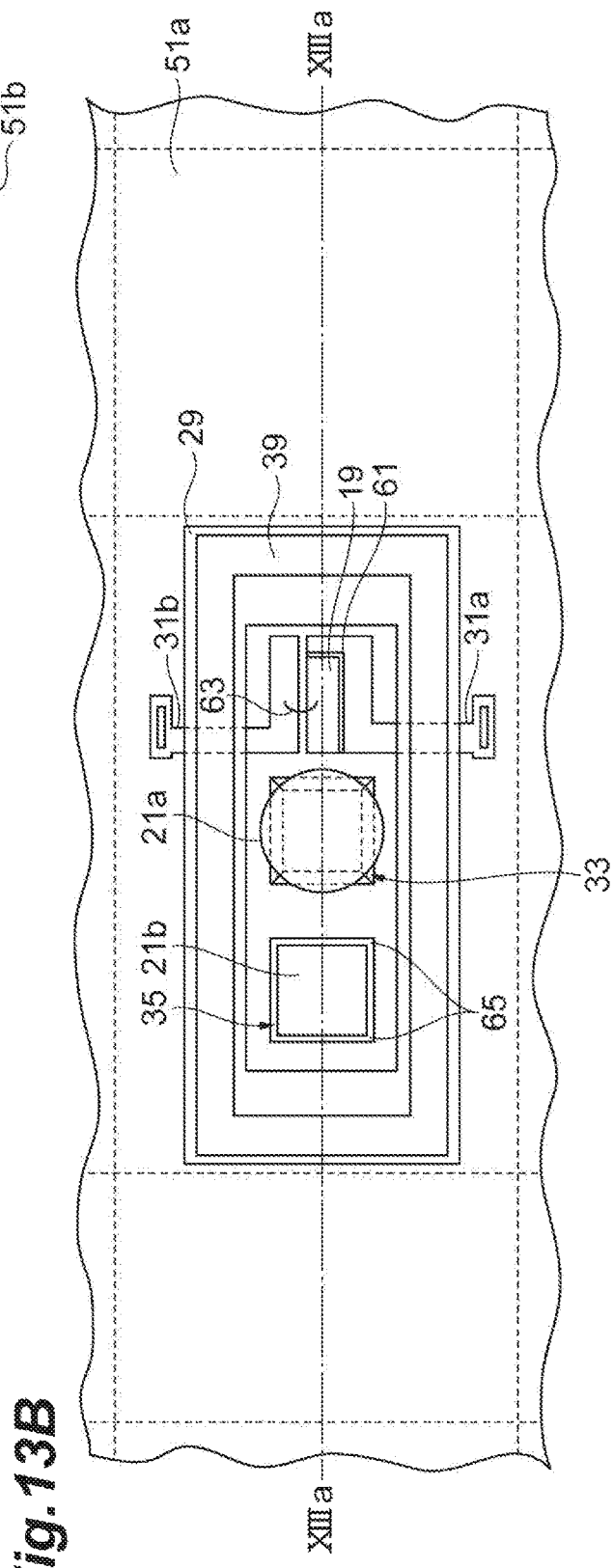

In step S111, as shown in FIGS. 13A and 13B, mounting the optical component 21 is performed. In the present embodiment, a ball lens and an isolator are arranged in the first recess 33 and the second recess 35, respectively. The bonding of the optical component 21 is performed with an adhesive member 65, such as epoxy adhesive. FIG. 13A shows a cross section taken along the XIIIa-XIIIa line shown in FIG. 13B.

Carrying out the above steps brings a bench product SPBN to completion, and the bench product SPBN comprises an array of sections for the bench part 13. FIG. 13B is a schematic plan view showing typical one section in step S111. The bench product SPBN comprises the silicon wafer 51, acting as a support, to which the above processes has been applied, and each section is provided with the semiconductor optical device 19 and the optical component 21 on the principal surface of the support. Further, the bench product SPBN has a structure for hermetic sealing.

In the subsequent description, a process of preparing a cap product for the cap 15 will be described with reference to FIGS. 14 to 21, and FIGS. 14, 16 and 19, each of which shows a cross section corresponding to that shown in FIG.

2. As will be understood from the subsequent description, producing a cap product will be described as an example of the preparation.

In step S201, as shown in part (a) of FIG. 14, a silicon wafer 71 is prepared as a single crystal semiconductor substrate. The thickness of the substrate can be, for example, 725 micrometers. The silicon wafer 71 has a first surface 71a and a second surface 71b, and the first surface 71a and second surface 71b of the silicon wafer 71 is preferably parallel to each other. In the present embodiment, each of the first surface 71a and the second surface 71b comprises, for example, the (001) plane of silicon, but is not limited thereto. The selection of the plane orientation is related to the angle ACP. Each of the first surface 71a and the second surface 71b may have an off-angle ranging from −1 to +1 degrees with respect to the (001) plane. The first surface 71a is opposite to the second surface 71b. The silicon wafer 71 has a size (e.g., 6 inches) enough to have an array of sections (sections for a cap base 23 for a single cap). In each section in the array, the silicon wafer 71 of the single crystal semiconductor substrate has a first region 71c, a second region 71d, a third region 71e, a fourth region 71f and a fifth regions 71g for each section. The first region 71c, the second region 71d, the third region 71e, the fourth region 71f and the fifth region 71g are arranged along a first reference plane RE1F. A third insulating film 73 and a fourth insulating film 75 are formed on the first surface 71a and the second surface 71b of the silicon wafer 71, respectively. Each of the third insulating film 73 and the fourth insulating film 75 can comprise, for example, a silicon oxide film.

A first inner opening and a second inner opening are formed on the first surface 71a of the silicon wafer 71, and an outer opening is formed on the second surface 71b of the silicon wafer 71. In the present embodiment, the formation of the first inner opening and the second inner opening may be followed by the formation of the outer opening. But, the outer opening may be formed prior to forming the first inner opening and the second inner opening.

Figure 15:
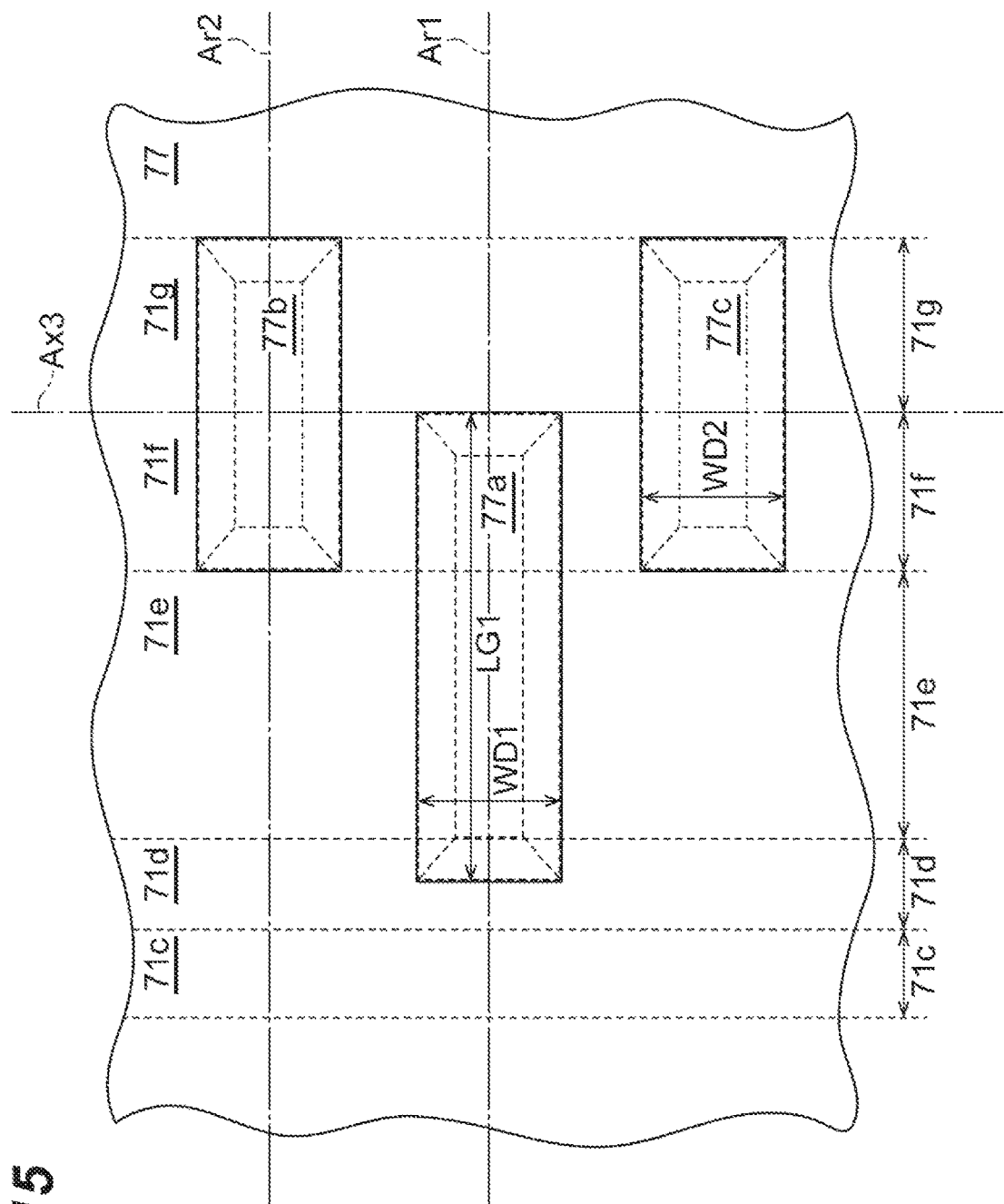
FIG. 15 is a top view showing the first surface of the silicon wafer on which a first mask is formed.
Figure 16:
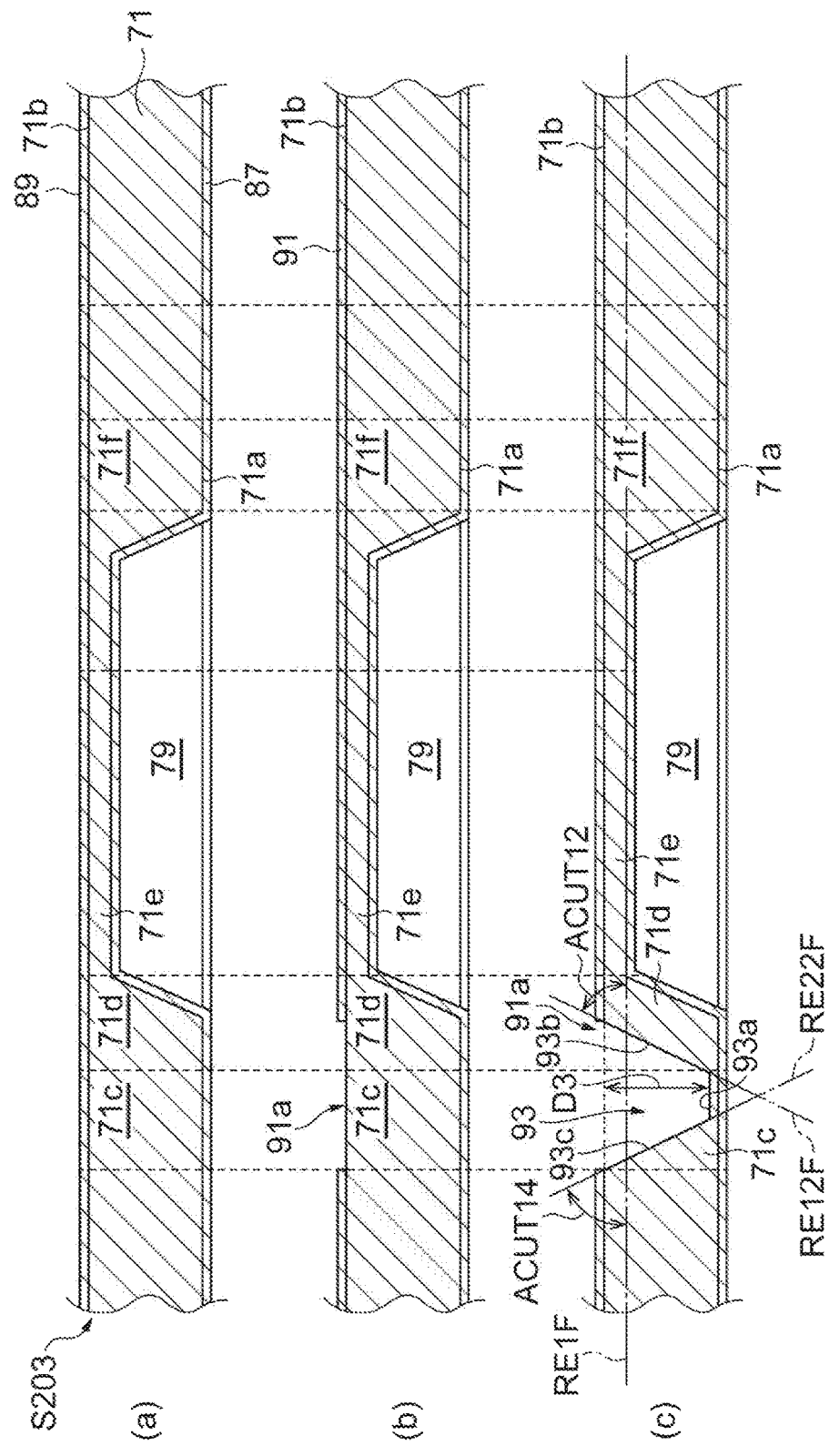
FIG. 16 shows cross sections in major steps in the method according to the present embodiment.

In step S202, an array of first inner openings each of which is prepared for the cavity 25 of the cap 15, and an array of second inner openings each of which is prepared for the first wing 16 and the second wing 18 are formed in the first surface 71a of the silicon wafer 71. As shown in part (b) of FIG. 14, the application of photolithography and etching produces a first mask 77 from the third insulating film 73 on the first surface 71a. FIG. 15 is a top view showing a first mask 77 formed on the first surface 71a of the silicon wafer 71. The first mask 77 includes a first opening pattern 77a for an inner opening used to provide the cavity 25, and second opening patterns 77b and 77c for respective second inner openings used to provide wings (the first wing 16 and the second wing 18). Explanation with reference to the second opening pattern 77b is given in the subsequent description. In FIG. 15, a first inner opening and second inner openings and an outer opening which are to be formed are shown by respective broken lines, which are drawn inside along the solid lines indicating the first opening pattern 77a and the second opening patterns 77b and 77c. The first opening pattern 77a extends in a direction of one of the <110> and <11-0> axes and has a shape of a stripe pattern in each section, in particular, a rectangle shape. The first opening pattern 77a has a first length LG1 and a first width WD1, which relates to the size of the cavity 25. The second opening patterns 77b and 77c also extend in the direction of the one of the <110> and <11-0> axes, and has a shape of a stripe pattern in each boundary between the sections, in particular, a rectangle shape extending across the boundary.

The second patterns 77b and 77c have a second width WD2 sufficient to provide each of pad electrodes (the first pad electrode 24p and the second pad electrode 24q) on the wings (the first wing 16 and the second wing 18). In the present embodiment, the first opening pattern 77a has a rectangular shape, provided in each section, with a pair of sides extending in the direction of the <110> axis of, for example, a crystal silicon, and another pair of sides extending in the direction of the <11-0> axis, and is disposed in each section. The second opening patterns 77b and 77c have a rectangular shape, provided in each section, with a pair of sides extending in the direction of the <110> axis of, for example, a crystal silicon, and another pair of sides extending in the direction of the <11-0> axis, and is disposed across a boundary between adjoining sections. The first and second opening patterns 77a, 77b and 77c may be alternately arranged in the direction of the third axis Ax3.

In FIG. 15, the first opening pattern 77a is formed over the second region 71d, the third region 71e and the fourth region 71f in each section of the silicon wafer 71, and the second opening patterns 77b and 77c are disposed over the fourth region 71f and the fifth region 71g. The second opening pattern 77b, the first opening pattern 77a and the second opening pattern 77c may be arranged in order in the direction of the third axis Ax3.

The silicon single crystal appearing at the first and second opening patterns 77a, 77b and 77c of the first mask 77 is etched using a KOH solution as an etchant, shown in parts (c) and (d) of FIG. 14, to form the first inner opening 79 and the second inner opening 83, respectively. The first inner the opening 79 for the cavity of the cap 15 extends along the direction of the first arrangement axis Ar1 in the second region 71d, the third region 71e and the fourth region 71f in each section of the silicon wafer 71. The second inner openings 83 and 84 for the first and second wings 16 and 18 extend along the direction of the second arrangement axis Ar2 in the fourth region 71f and the fifth region 71g in each section of the silicon wafer 71. The first arrangement axis Ar1 and the second arrangement axis Ar2 are arranged along the direction of the first reference plane RE1F in the direction intersecting with the third axis Ax3 in each section. Subsequent description will be given with reference to the first inner opening 79 and the second inner opening 83. The first inner opening 79 has a bottom face 79a, a front inner face 79b and a rear inner face 79c. The bottom face 79a extends along the direction of the first reference plane RE1F. The first region 71c, the second region 71d, the third region 71e, the fourth region 71f and the fifth region 71g are arranged in order along the first reference plane RE1F. The bottom face 79a of the first inner opening 79 is disposed in the third region 71e, and may be disposed in the third region 71e and the fourth region 71f. The rear inner face 79c is disposed in the fourth region 71f, and is not disposed in the fifth region 71g. The front inner face 79b of the first inner opening 79 is disposed in the second region 71d. The front inner face 79b of the first inner opening 79 extends along the first inner reference plane RE11F inclined at an acute angle ACUT11 to the first reference plane RE1F, and the rear inner face 79c of the first inner opening 79 extends along the second inner reference plane RE21F inclined at an acute angle ACUT21 for the first reference plane RE1F, so that the first inner opening 79 has a trapezoidal cross sectional shape. The first inner opening 79 includes a first side face 79d and a second side face 79e that are to form the inner surface of the side wall of the cap. The first side face 79d connects an edge of the front inner face 79b to an edge of the rear inner face 79c, and the second side face 79e connects another edge of the front inner face 79b to another edge of the rear inner face 79c. Further, the second inner opening 83 has a first side face 83b (the rear end face 16p of the rear end 16c of the first wing 16 shown in FIG. 1, and the rear end face 18p of the rear end 18c of the second wing 18) is disposed in the fourth region 71f, and the bottom face 83a is disposed in the fifth region 71g. The bottom 83a may be disposed in the fourth region 71f and the fifth region 71g. The inner rear face 83c is disposed in the fifth region 71g. The first side face 83b of the second inner opening 83 extends along the second outer reference plane RE13F inclined at an acute angle ACUT13 with respect to the first reference plane RE1F, and the inner rear face 83c extends along a third reference plane RE23F inclined at an acute angle ACUT23 with respect to the first reference plane RE1F, so that the second inner opening 83 has a trapezoidal cross sectional shape. The second inner opening 83 includes a second side face 83d and a third side face 83e. The second side face 83d connects an edge of the first side face 83b to an edge of the inner rear face 83c, and the third side face 83e connects another edge of the first side face 83b to another edge of the inner rear face 83c. A first division wall for the first side wall 15d is disposed in a region between the first inner opening 79 and the second inner opening 83, and a second division wall for the second side wall 15e is disposed in a region between the first inner opening 79 and the second inner opening 84.

Specifically, the bottom face 79a of the inner opening 79 is provided with the (001) plane of silicon; the front inner face 79b and the rear inner face 79c each include, for example, the (111) plane of silicon; and the first side face 79d and the second side face 79e each include, for example, the (111) plane of silicon. The first depth D1 of the inner opening 79 (for example, a distance between the bottom face 79a and the first face 71a) is, for example, 650 micrometers, and can be in a range of 500 to 700 micrometers. The second depth D2 of the first outer opening 83 (e.g. the distance between the bottom face 83a and the first surface 71a) can be substantially the same depth as the first depth D1. Further, the bottom face 83a of the first outer opening 83 is provided with the (001) plane of silicon, the first side face 83b and the inner rear face 83c include, for example, the (111) plane of silicon, and the second side face 83d and the third side face 83e each include, for example, the (111) plane of silicon. After the first inner opening 79 and the second inner opening 83 has been formed, the first mask 77 and the fourth insulating film 75 are removed therefrom.

Figure 17:
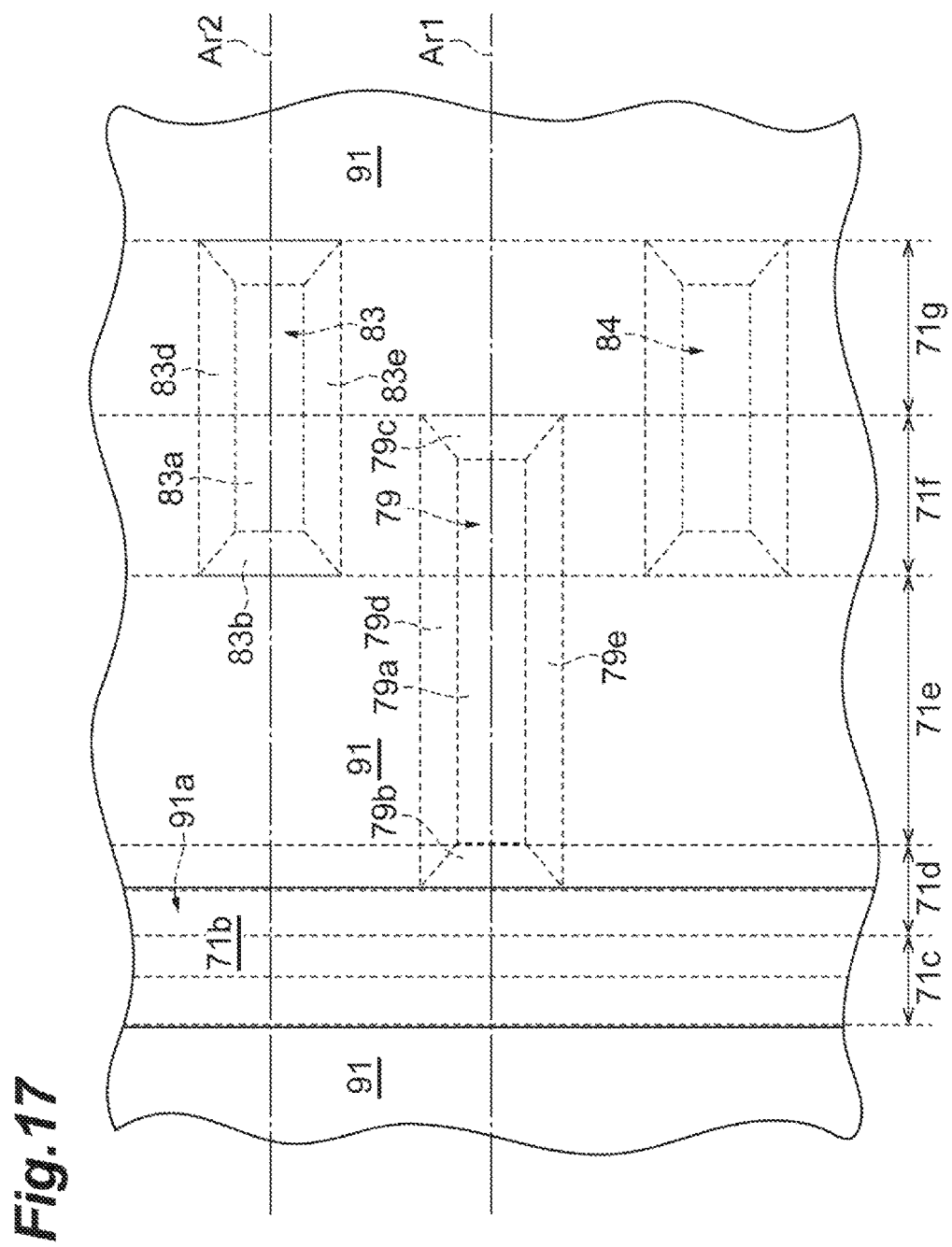
FIG. 17 is a top view showing the second surface of the silicon wafer on which a second mask is formed.

In step S203, the arrangement of outer openings for the front wall of the cap 15 is formed on the second surface 71b of the first region 71c and the second region 71d in each section of the single crystal semiconductor substrate. As shown in part (a) of FIG. 16, a fifth insulating film 87 and a sixth insulating film 89 are grown on the first surface 71a and the second surface 71b of the silicon wafer 71, respectively. Each of the fifth insulating film 87 and the sixth insulating film 89 may comprise, for example, a silicon oxide film. As shown in part (b) of FIG. 16, the application of photolithography and etching processes to the sixth insulating film 89 forms the second mask 91 on the second surface 71b. The second mask 91 has a third opening pattern 91a for an outer opening formed for an outer face of the front wall 15b of the cap 15. FIG. 17 is a plan view showing a second mask 91 on the second surface 71b of the silicon wafer 71. In FIG. 17, an outer opening to be formed is shown by a dashed line drawn inside along the solid line that indicates the third opening pattern 91a. The third opening pattern 91a can has a pattern with a stripe shape extending across a boundary between adjoining sections in a direction of the other of <110> and <11-0> axes (the same direction as the arrangement of the first opening patterns 77a of FIG. 15), and in particular, may have a rectangular shape extending in the direction of the other of <110> and <11-0> axes (the same direction as the arrangement of the first opening patterns 77a of FIG. 15). In the present embodiment, the third opening pattern 91a is provided for defining grooves for the front wall 15b used for light emission and/or light reception of the optical module 11, so that the third opening pattern 91a extends to traverse the sections. Wet etching is performed with the second mask 91. As shown in part (c) of FIG. 16, an etching process using a KOH solution as an etchant with the second mask 91 is applied to a part of the silicon single crystal, which appears at the third opening pattern 91a of the second mask 91, to form an outer opening 93. The outer opening 93 includes a bottom face 93a, a first side face 93b and a second side face 93c. The bottom face 93a of the outer opening 93 extends in the direction in which the first reference plane RE1F extends. The bottom face 93a is provided in the first region 71c; the first side face 93b is disposed in the second region 71d; and the second side face 93c is disposed in the first region 71c. The first side face 93b of the outer opening 93 extends along the first outer reference plane RE12F inclined at an acute angle ACUT12 with respect to the first reference plane RE1F, and the second side face 93c of the outer opening 93 extends along a fourth reference plane RE22F inclined at an acute angle ACUT14 with the first reference plane RE1F. The side face 93b and the other side face 93c of the second outer opening 93 each include, for example, the (111) plane of silicon, and the bottom face 93a may include the (001) plane of silicon. After the outer opening 93 has been formed, the second mask 91 and the fifth insulating film 87 is removed therefrom. The third depth D3 of the second outer opening 93 (e.g. the distance between the second face 71b and the bottom face 93a) can be, for example, 675 micrometers, which is defined as a distance to the second surface 71b, and can be in a range of 600 to 700 micrometers.

Figure 18:
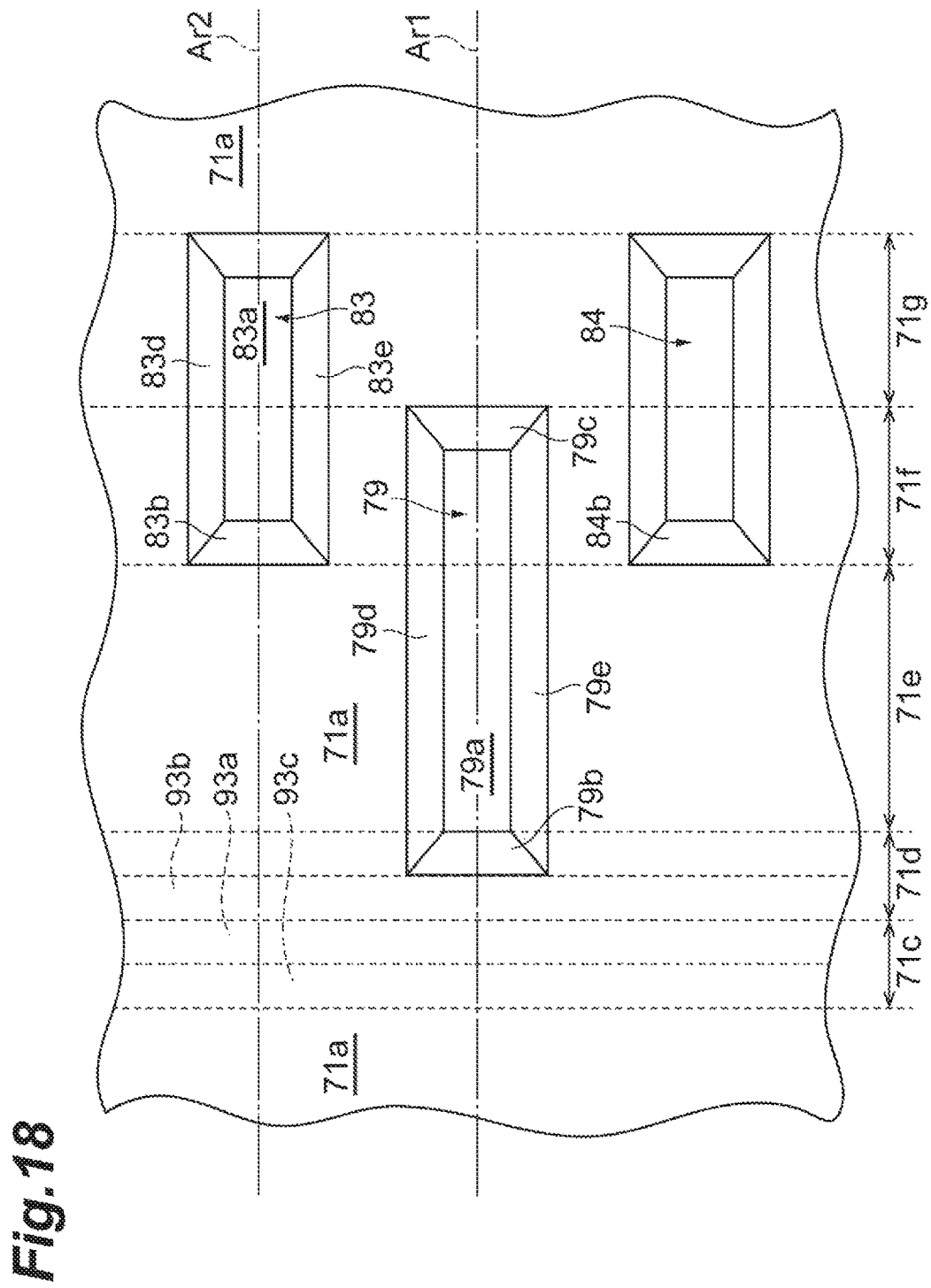
FIG. 18 is a top view showing the first surface of the silicon wafer exposed by removing the insulating film therefrom.

FIG. 18 is a plan view showing the first surface 71a of the silicon wafer 71 in the step which follows the removal of the insulating film. The front inner face 79b of the first inner opening 79 and the first side face 93b of the outer opening 93 are formed in the second region 71d to form a dividing wall. The distance between the front inner face 79b and the first side face 93b is associated to the thickness (e.g., thickness TH in FIG. 2) of the front wall 15b of the cap 15 made by the present fabricating method, and this thickness relates to the amount of shift of the optical axes (the shift amount SHF in FIG. 2). This shows that the shift amount SHF can be varied depending upon the arrangement of the first inner opening 79 and the outer opening 93. The thickness TH of the front wall 15b can be for example, about 100 micrometers. The thickness TH is defined in a direction perpendicular to, for example, the (111) plane of silicon.

Figure 19:
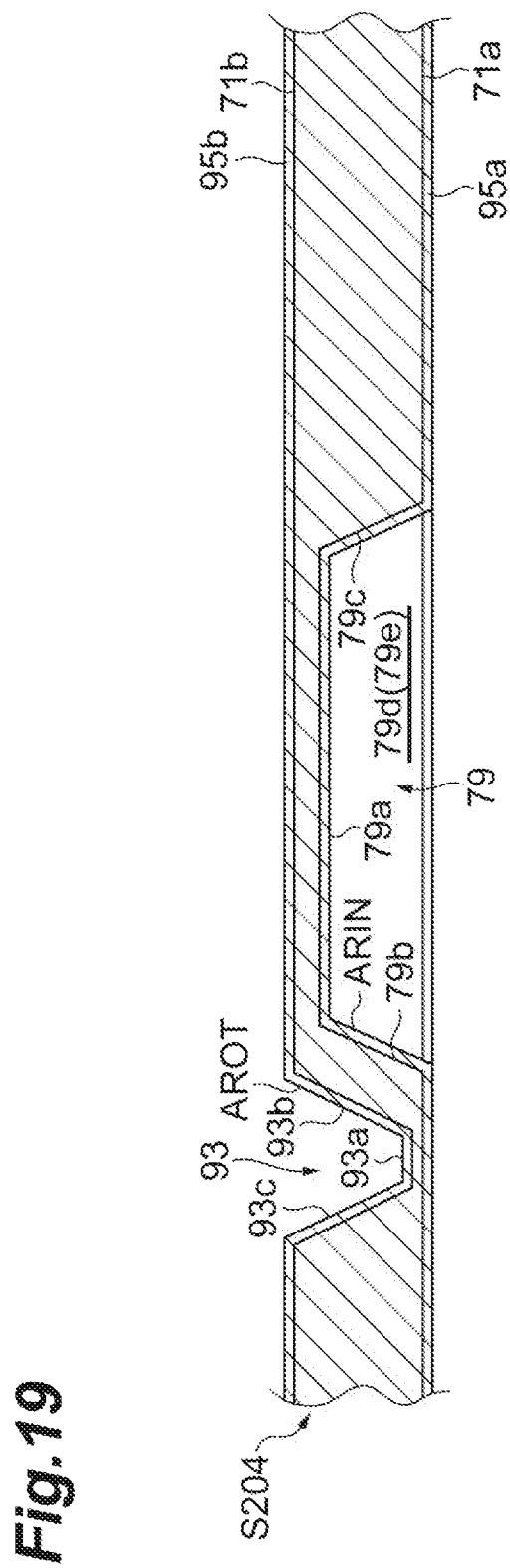
FIG. 19 is a cross sectional view showing a major step in the method according to the present embodiment.

After forming the first inner opening 79, the second inner opening 83 and 84, and the outer opening 93 in step S204, as shown in FIG. 19, a seventh insulating film 95a and an eighth insulating film 95b are grown on the first and second face 71a and 71b of the silicon wafer 71, respectively. The seventh insulating film 95a and the eighth insulating film 95b each include an insulating film acting as an antireflection film, such as, silicon oxynitride film (SiON). Specifically, the antireflection film ARIN is provided on the front inner face 79b of the first inner opening 79, and the anti-reflection film AROT is also provided on the first side face 93b of the outer opening 93.

Figure 20:
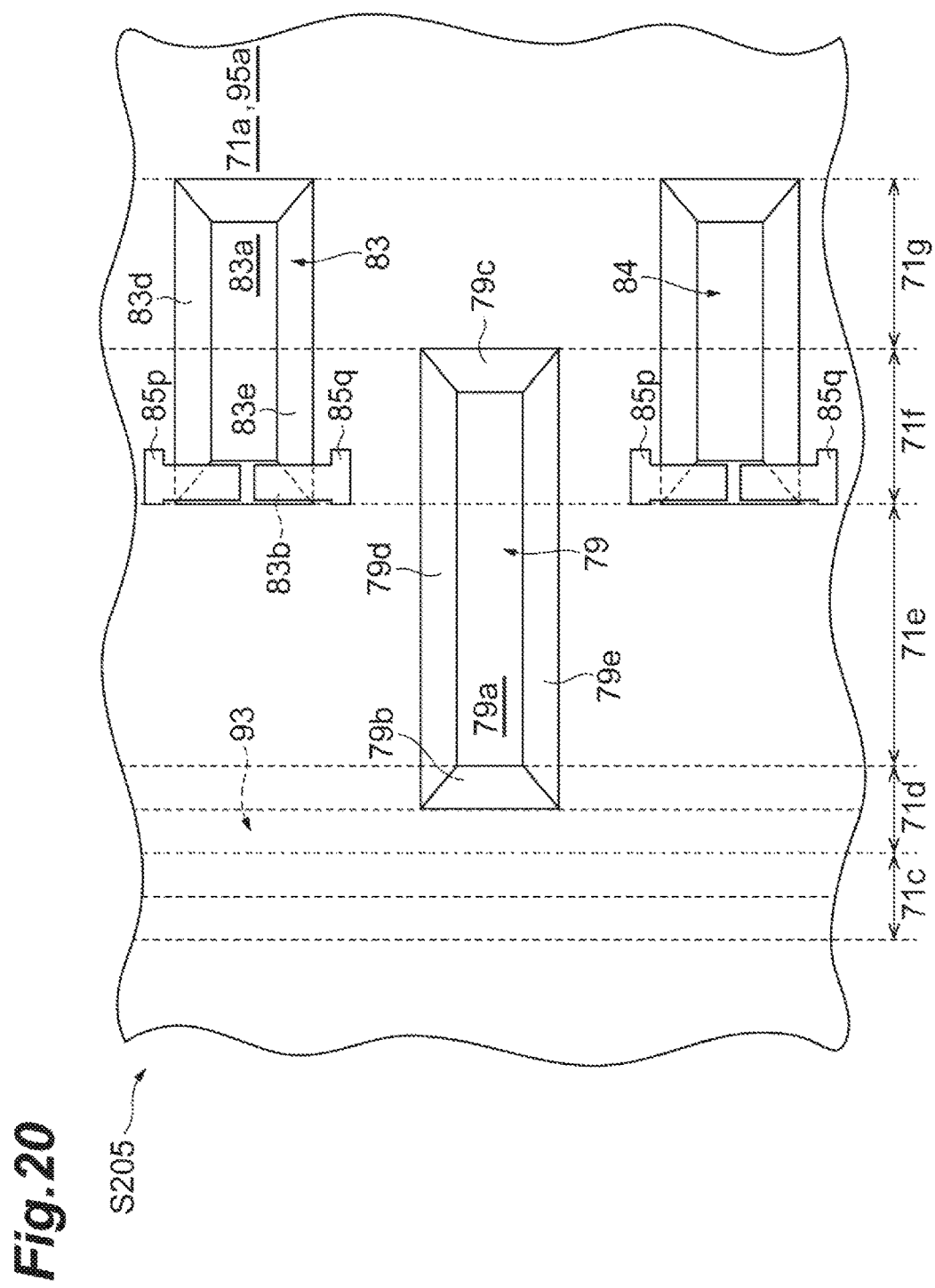
FIG. 20 is a top view showing the first surface of the silicon wafer on which the wiring metal layer is formed.

After these insulating films is formed, in step S205, as shown in FIG. 20, a first wiring metal layer 85p is formed for the first pad electrodes 24p and the first conductors 26p, and a second wiring metal layer 85q is formed for the second pad electrodes 24q and the second conductors 26q. The first wiring metal layer 85p and the second wiring metal layer 85q each include, for example, gold. Specifically, the first wiring metal layer 85p and the second wiring metal layer 85q are formed by a lift-off method. The formation of a sacrificial layer having a pattern for lift-off is followed by the growth of metal by a vapor deposition method. The sacrificial layer may be a resist film, and the metal film comprises, for example, a Ti/Pt/Au (100 nm/200 nm/500 nm). After depositing the metal film on the silicon wafer 71, the silicon wafer 71 is immersed in a remover solution for the sacrificial layer to lift off the metal film, thereby forming a patterned metal film, in particular, the first wiring metal layer 85p and the second wiring metal layer 85q both of which are patterned for each section. In the present embodiment, the first wiring metal layer 85p and the second wiring metal layer 85q are provided on the first surface 71a of the fourth region 71f, and the first side face 83b, the second side face 83d and the fourth side face 83e of the second inner opening 83. The first wiring metal layer 85p starts to extend from the first side face 83b, extends on the second side face 83d of the fourth region 71f to reach the first surface 71a, and terminates thereat, and the second wiring metal layer 85q starts to extend from the first side face 83b, extends on the fourth side face 83e of the fourth region 71f to reach the first surface 71a, and terminates thereat. The first wiring metal layer 85p and the second wiring metal layer 85q provide conductors for the first conductor 26p and the second conductor 26q for electrical connection on the first surface 71a of the fourth region 71f, and conductors for the first pad electrodes 24p and the second pad electrodes 24q on the first side face 83b of second inner opening 83, and if necessary, may provide conductors on the second side face 83d and the fourth side face 83e of the second inner opening 83.

Figure 21:
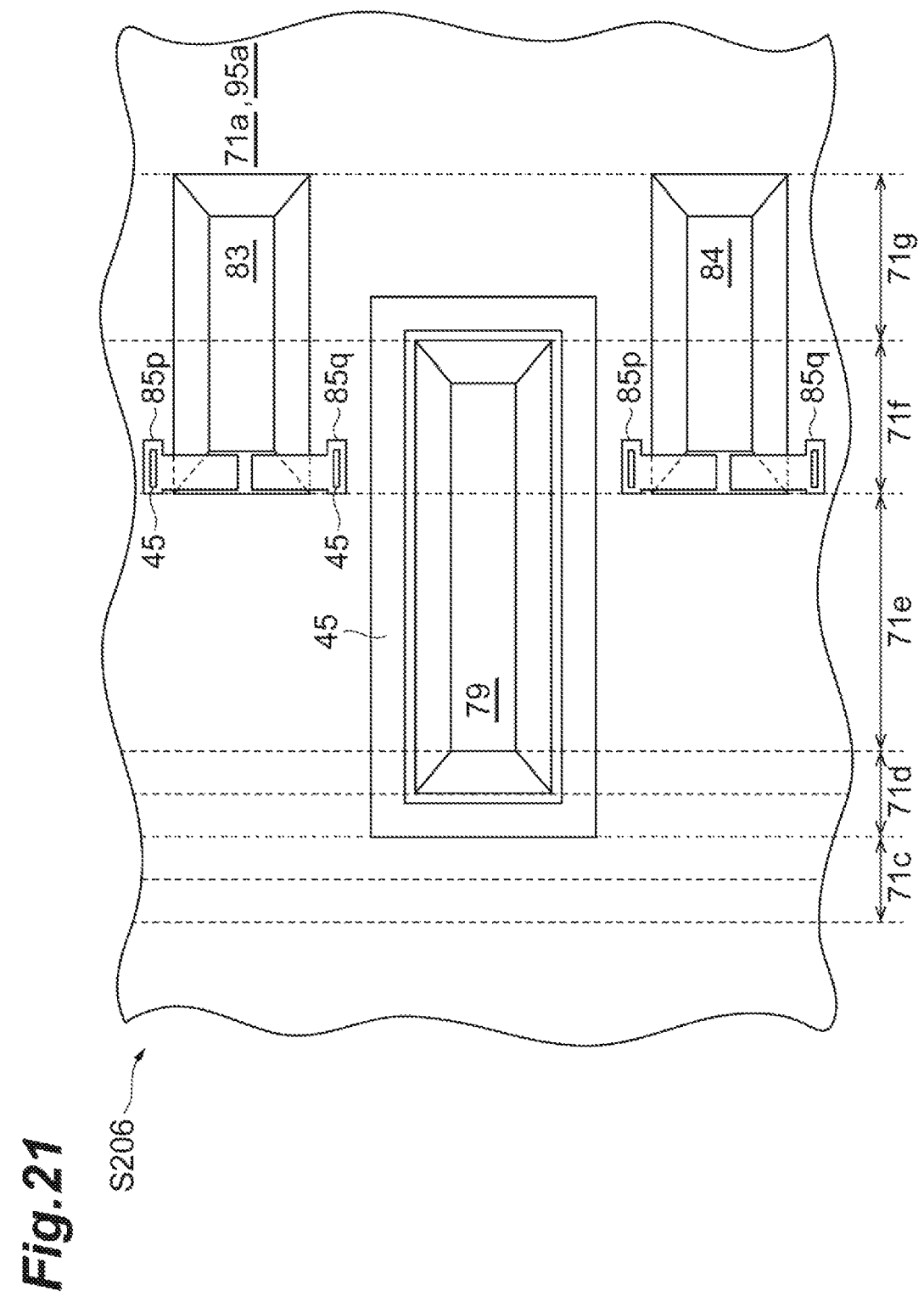
FIG. 21 is a top view showing the first surface of the silicon wafer on which the wiring metal layer and the upper metal layer are formed.

In step S206, as shown in FIG. 21, a sealing member is formed. The sealing member may be made of, for example, a metal member, an organic resin, or other materials. In the present embodiment, the sealing member to be formed includes a metallic material for sealing and bonding. Specifically, the upper metal layer 45 for hermetic sealing and bonding is formed by a lift-off method. More specifically, a sacrificial layer with a pattern for lift-off is formed on the silicon wafer 71, and a metal film is grown thereon by vapor deposition. The sacrificial layer may be a resist film, and the metal film thus grown may be made of, for example, a Ti/Pt/Au/AuSn (100 nm/200 nm/50 nm/2000 nm). After the metal film is deposited, the silicon wafer 71 is immersed in a remover solution for the sacrificial layer to perform the lift-off of the metal film, thereby forming a patterned metal film, for example, the upper metal layer 45 for each section in the present embodiment. For obtaining an adequate sealing, the size, the position and the shape of the upper metal layer 45 correspond to those of the lower metal layer 39. In the present embodiment, the upper metal layer 45 is formed so as to encircle the first inner opening 79 for the cavity 25. The upper metal layer 45 is formed on the first wiring metal layer 85p and the second wiring metal layer 85q on the first surface 71a of the fourth region 71f to obtain an adequate bonding.

Carrying out the above steps brings a cap product SPCP to completion, and the cap product SPCP comprises an array of sections each of which is prepared for the cap 15. Assembling the bench product and the single crystal semiconductor substrate subjected to the above processing fabricates an assembly.

FIG. 21 is a view showing the first surface 71a of the silicon wafer 71 on which the first wiring metal layer 85p, the second wiring metal layer 85q and the upper metal layer 45 have been formed. In FIG. 21, the first inner opening 79 on the first surface 71a is shown by a solid line, and the outer opening 93 on the second surface 71b is shown by a dashed line. The front inner face 79b of the first inner opening 79 and the first side face 93b of the outer opening 93 extend in the same direction, and may include for example, the (111) plane of silicon. In a preferred embodiment, the front inner face 79b and the first side face 93b are substantially parallel to each other.

Figure 22:
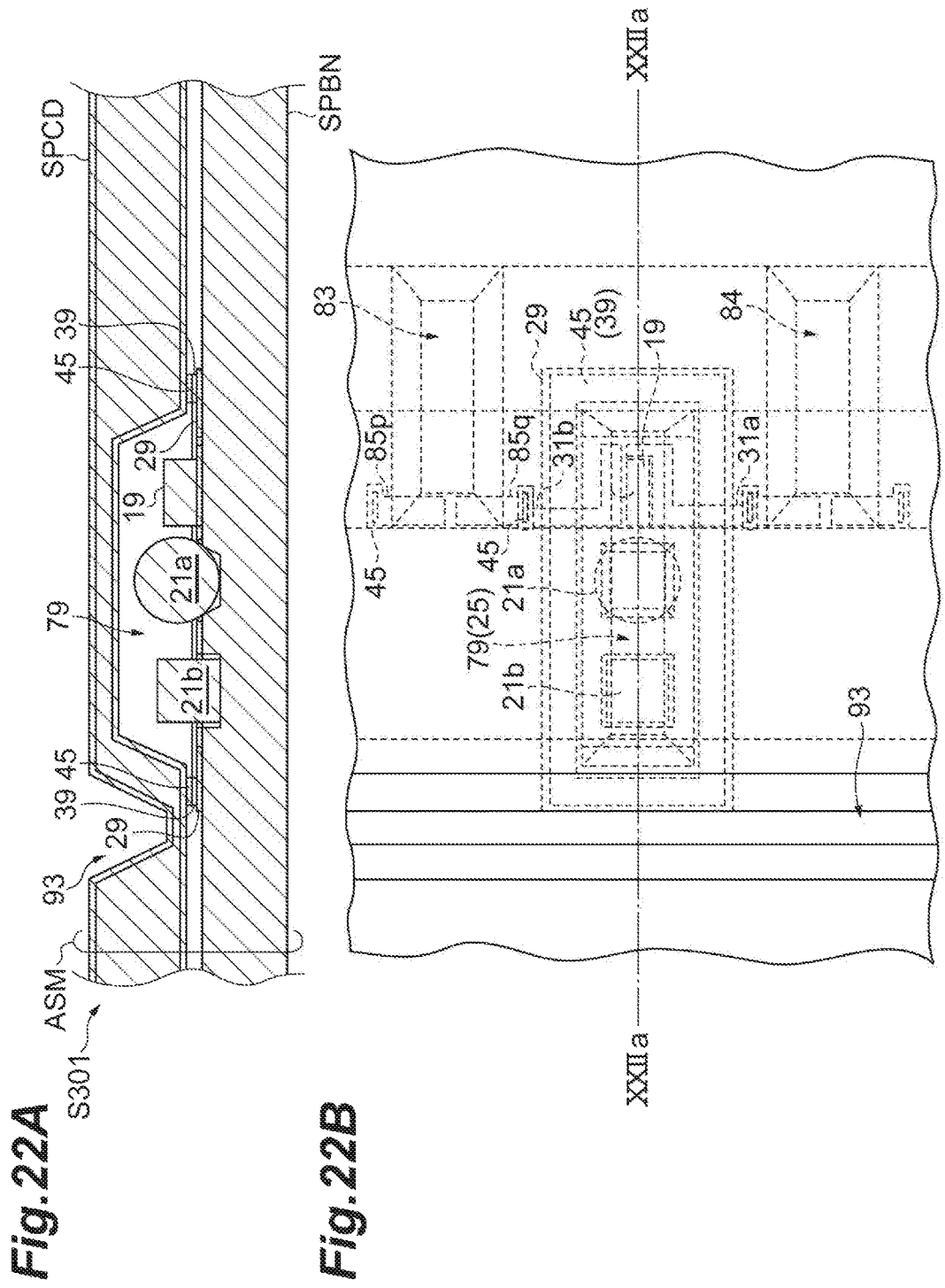
FIGS. 22A and 22B are schematic views each showing the process of joining the bench product and the cap product with each other.

A process of fabricating an optical module from the bench product SPBN and the cap product SPCP will be described in detail below. FIGS. 22A and 22B schematically show a step of bonding the bench product SPBN to the cap product SPCP. FIG. 22A shows a cross section taken along the XXIIIa-XXIIIa line in FIG. 22B. As shown in FIGS. 22A and 22B, in step S301, one of the bench product SPBN and the cap product SPCP is disposed on the other such that the front inner faces 79b of the first inner opening 79 of the cap product SPCP are aligned with the axis of the arrangement of the semiconductor optical device 19 and the optical component 21, and the heat treatment of the bench product SPBN and the cap product SPCP thus aligned is carried out to make a sealed product, for example, an assembly ASM, which is produced from the bench product SPBN and the cap product SPCP. In the above-described arrangement of the bench product SPBN and the cap product SPCP, the lower metal layer 39 and the upper metal layer 45 are positioned to each other. The application of the heat treatment to the lower and upper metal layers 39 and 45 forms the joined lower and upper metal layers 39 and 45, so that the sealed cavity 25 is formed in each section, and the electrodes 31a and 31b, the first wiring metal layer 85p, and the second wiring metal layer 85q are joined together to complete the electrical connection between the cap 15 and the bench part 13. The assembly ASM is provided with both the hermetic sealing and the electrical connection. The cavity 25 provided by the first inner opening 79 of the cap product SPCP can accommodate the semiconductor optical device 19, the lens 21a and the optical isolator 21b of the bench product SPBN.

Figure 23:
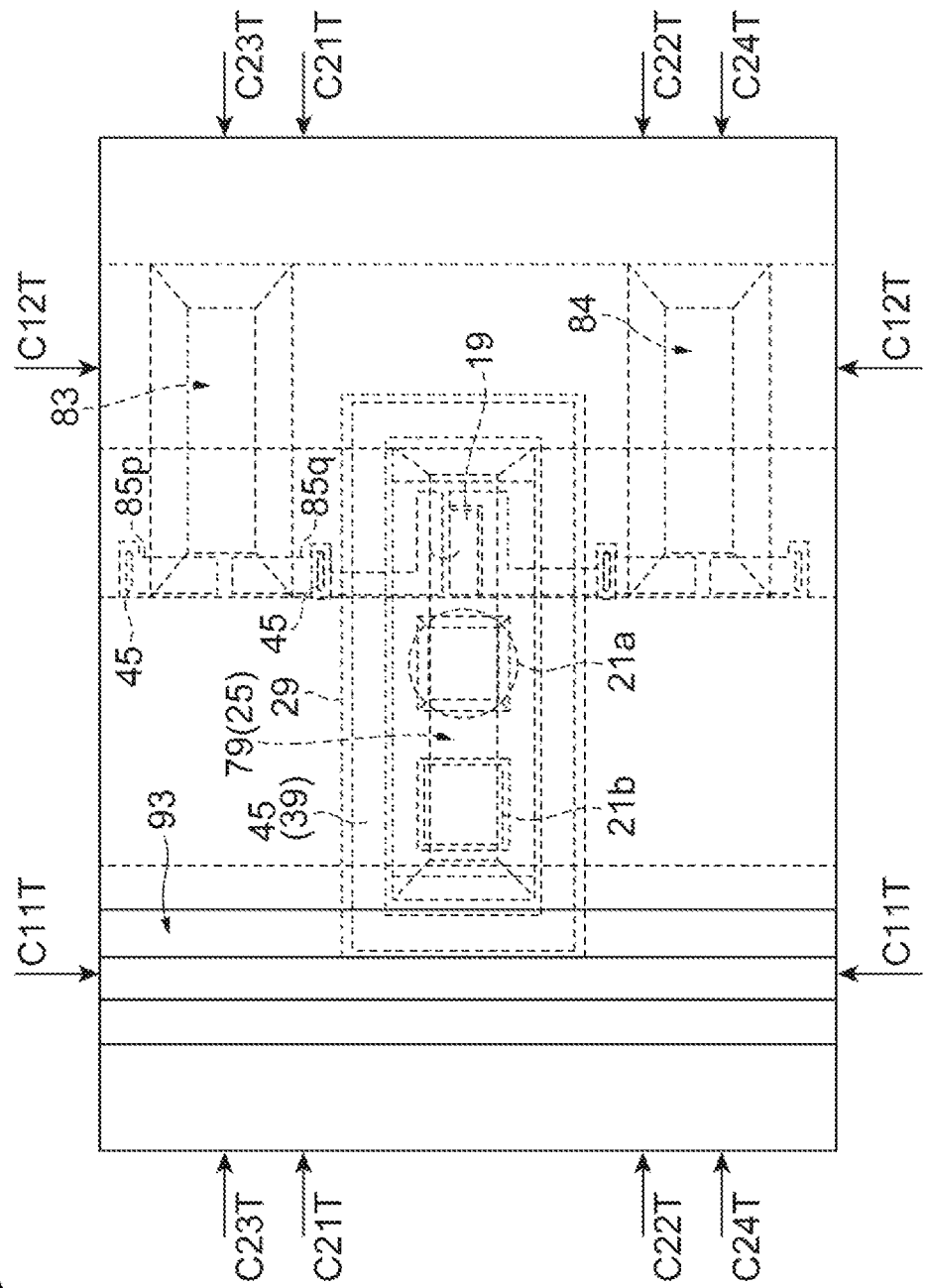
FIG. 23 is a top view illustrating the assembly ASM on which first and second cutting lines extending in the first direction in, and third, fourth and fifth cutting lines extending in the second direction intersecting with the first direction are overwritten.

The assembly ASM is cut to form a number of optical modules. FIG. 23 shows the upper surface of the cap product SPCP of the assembly ASM. The outer opening 93 appears on the upper surface of the cap product SPCP. FIG. 23 shows a first transverse cutting line C11T and a second transverse cutting line C12T which extend in a first direction on the assembly ASM, and a first longitudinal cutting line C21T, a second longitudinal cutting line C22T, a third longitudinal cutting line C23T and a fourth longitudinal cutting line C24T which extend in a second direction perpendicular to the first direction. For example, a process of cutting along the first transverse cutting line C11T and the second transverse cutting line C12T are followed by a process of cutting along the first longitudinal cutting line C21T, the second longitudinal cutting line C22T, the third longitudinal cutting line C23T and the fourth longitudinal cutting line C24T to produce the optical module. The optical module can be also produced with the reverse order of these cutting processes.

For example, in step S302, the assembly ASM (both of the cap product SPCP and the bench product SPBN) is cut in the first direction indicated by the first and second transverse cutting lines C11T and C12T. This cutting process is performed using a cutting device, such as a dicing saw. The first transverse cutting line C11T is defined so as to leave the first side face 93b of the outer opening 93. This process of cutting on the first transverse cutting line C11T forms the front wall 15b, and the tip TIP of the front wall 15b and the rear wall 15c for the optical module 11, and eliminates the bottom face 93a of the outer opening 93. The second transverse cutting line C12T may be defined so as to form the rear wall 15c, and this process of cutting on the second transverse cutting line C12T forms the rear wall 15c. These cutting processes provide optical module bars acting as one embodiment of an optical module component. Each optical module bar comprises optical modules, which are arranged in one direction to form an one-dimensional array. In the present embodiment, the assembly ASM (including both the cap product SPCP and the bench product SPBN) is cut, so that the end of the rear wall 15c of the cap 15 is located on the vertical plane on which the rear edge 27e of the bench part 13 is also located.

Figure 24A:
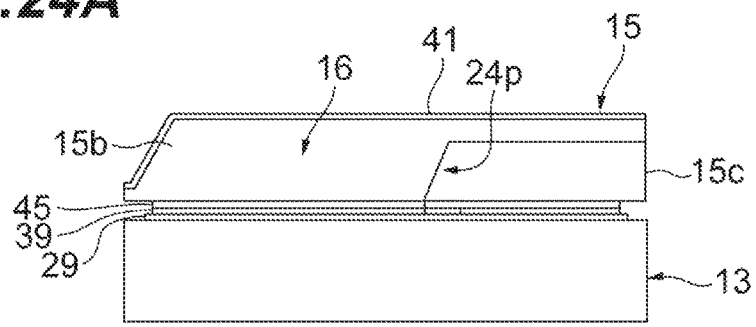
FIGS. 24A, 24B and 24C are schematic views each showing an optical module formed by the fabricating method.
Figure 24B:
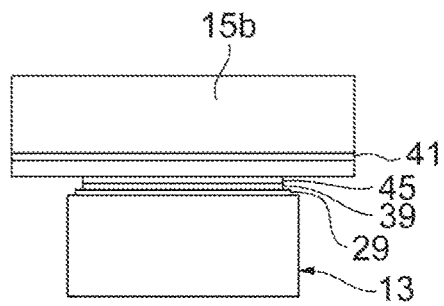
Figure 24C:
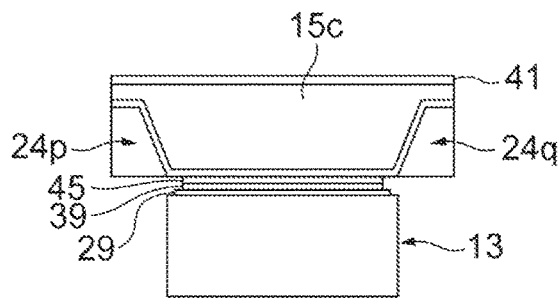

In step S303, in the second direction indicated by the third longitudinal cutting line C23T and the fourth longitudinal cutting line C24T, respective cuttings of the cap product SPCP in the optical module bar is performed, and in the second direction indicated by the first longitudinal cutting line C21T and the second longitudinal cutting line C22T, respective cuttings of the bench product SPBN in the optical module bar is performed. These cuttings are performed using the cutting device 97, such as a dicing saw. The cutting processes in this order allow the production of the optical module from the assembly ASM. The cutting processes in the inverse order also allow the production of another optical module from the assembly ASM. FIGS. 24A, 24B, and 24C each show an appearance of an optical module produced by the former process. FIG. 24A is a front elevational view showing the optical module formed by cutting the optical module bar. FIG. 24B is a front view showing the optical module produced by cutting the optical module bar. FIG. 24C is a rear view showing the optical module produced by cutting the optical module bar. In the present embodiment, the cap product SPCP in the optical module bar is cut from the top of the cap product SPCP along the third longitudinal cutting line C23T and the fourth longitudinal cut line C24T, which are positioned to the second inner openings 83 and 84 of the assembly ASM, respectively, and the bench product SPBN of the assembly ASM is cut along the first longitudinal cutting line C21T and the second longitudinal cutting line C22T positioned outside of the first inner opening 79 of the assembly ASM. In the cutting process in the present embodiment, the spacing between the first longitudinal cutting line C21T and the second longitudinal cutting line C22T for the bench product SPBN is made smaller than the spacing between the third longitudinal cutting line C23T and the fourth longitudinal cutting line C24T for the cap 15.

The method for producing an optical module 11 forms both the first inner opening 79 for the cavity, which has the bottom face 79a positioned on the third region 71e and the fourth region 71f of the silicon wafer 71 used as an exemplary single crystal semiconductor substrate, and the second inner openings 83 and 84 for the first wing 16 and the second wing 18, which have the respective side faces 83b and 84b located in the fourth region 71f of the silicon wafer 71, by etching the first surface 71a, and forms the outer opening 93 for the front wall 15b, which has the bottom 93a in the first region 71c of the silicon wafer 71, by etching the second surface 71b. Each of the first opening pattern 77a of the first mask 77 and the third opening pattern 91a of the second mask 91 is patterned such that the first side face 93b of the outer opening 93 and the front inner face 79b of the first inner opening 79 are located in the second region 71d of the silicon wafer 71. The first opening pattern 77a of the first mask 77 is located in the third region 71e, and the second opening pattern 77b of the first mask 77 is located in the fourth region 71f and the fifth region 71g. The above etching processes allows the formation of the first inner opening 79, the second inner openings 83 and 84, and the outer opening 93 for the front wall 15b, the rear wall 15c and the cavity 25 of the cap 15. The front inner face 79b of the first inner opening 79, the first side face 93b of the outer opening 93, and the first side face 83b of the second inner opening 83 extend along the first inner reference plane RE11F, the first outer reference plane RE12F, and the second outer reference plane RE13F, respectively, and the first inner reference plane RE11F, the first outer reference plane RE12F, and the second outer reference plane RE13F form an acute angle ACUT11, an acute ACUT12 and an acute ACUT13 with respect to the first reference plane RE1F, respectively. The first wiring metal layer 85p and the second wiring metal layer 85q for the first pad electrode 24p, the second pad electrode 24q, the first conductor 26p and the second conductor 26q are formed on the fourth region 71f of the single crystal semiconductor substrate, and the resultant optical module 11 has the first pad electrode 24p and the first conductor 26p, and the second pad electrode 24q and the second conductor 26q formed on the first wing 16 and the second wing 18, respectively. The fabricating method forms the optical module 11 which allows the electrical connection with an external device through wiring metal layers on the silicon wafer 71 (the first wiring metal layer 85p and the second wiring metal layer 85q) without providing the bench product SPBN with electrodes (electrodes on the bench part). The optical module 11 can relax restrictions on t the optical coupling thereof with the optical module 11 mounted.

Further, the fabricating method forms the outer opening 93 for separation, which has the bottom face 93a in the third region 71e of the silicon wafer 71, in the second surface 71b, and forms the first inner opening 79 for the cavity, which has the bottom 79a is located in the first region 71c of the silicon wafer 71, in the first surface 71a. In the second region 71d of the silicon wafer 71, the front inner face 79b of the first inner the opening 79 and the first side face 93b of the outer opening 93 are disposed. The front inner face 79b of the first inner opening 79 and the first side face 93b of the outer opening 93 extend along the first inner reference plane RE11F and the first outer reference plane RE12F, respectively, and the first inner reference plane RE11F and the first outer reference plane RE12F form acute angles ACUT11 and ACUT12 with respect to the first reference plane RE1F, respectively. Light passing through the side face 79b and the side face 93b is refracted twice at the front inner face 79b and the side face 93b, and these refractions make the level at which the optical axis intersects with the first side face 93b of the outer opening 93 higher than that at which the optical axis intersects with the front inner face 79b of the first inner opening 79 with respect to the bottom face 93a of the outer opening 93 in the direction from the first surface 71a of the silicon wafer 71 to the second surface 71b. This difference in height allows the intersection of the optical axis and the outer face of the front wall 15b of the cap 15 to be apart from the edge of the first side face 93b of the outer opening 93 in the direction normal to the bottom face 93a of the outer opening 93, and breaking a product along the bottom face 93a of the outer opening 93 in the fabricating of the cap 15 forms a separation edge (the tip TIP) which is likely to have a shape with optical non-uniformity, and can distance the intersection of the optical axis and the first side face 93*b* of the outer opening 93 from the non-uniform shape. The present embodiment described above can provide a method for producing an optical module that can be optically coupled to the side of the module rather than the back surface of the substrate.

EXAMPLE

The method according to the above-described embodiment produces an LD module which includes a laser diode acting as the semiconductor optical device 19. The LD module has vertical, transverse and height dimensions of, for example, about several millimeters. In the LD module, as shown in FIG. 2, the laser beam emitted from the laser diode is collimated by a lens. The collimated light beam is not made perpendicularly incident on the (111) plane of silicon of the front wall of the cap, in particular, and the (111) plane is inclined at a non-right angle with respect to the (111) plane (e.g. 54.7 degrees). The incidence angle is determined by the directional relationship between the (111) plane and the plane orientation of the silicon-based principal surface. Since the refractive index of the silicon semiconductor (about 3.4) is larger than the refractive index of air (about 1), the laser light beam enters the silicon semiconductor of the front wall to be refracted, so that the incidence direction of the laser light beam is changed to the propagating direction in the silicon semiconductor of the front wall of the cap with respect to an incident position in the direction from the bench of the LD module to the cap. Further, the laser light beam propagating in the silicon semiconductor of the front wall of the cap is refracted again in the emission from the front wall of the cap at a higher position than the incident position to propagate parallel to the incident direction of the laser light beam. The LD module having a structure enabling the light beam to pass through the front wall can be produced, thereby reducing the influence of the tip of the front wall (influence of the light scattering thereat), which is formed by dicing in the production process. In the fabrication of the LD light module, the LD light module is separated by dicing the cap product SPCP, and in the LD light module fabricated as described above, the optical propagation path on which the laser light beam passes across the front wall of the silicon cap is changed away from the tip of the front wall which is produced by dicing.

The LD module is supported by an external device at the front wall of the cap having an inner face and an outer face each of which has a (111) plane, and the laser diode is electrically fed through both the pad electrodes on the cap and the electrodes on the bench. The module in which a laser diode is connected to electrodes on the cap via electrodes on the bench allows the laser diode to optically couples to an external device through the front wall of the cap having the inner and outer faces of the (111) plane.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:
1. An optical module including:
a bench part including a bench, an electrode, a semiconductor optical device, and a lens, the bench having a principal surface with a first area and a second area, the electrode being disposed on the first area and the second area, the semiconductor optical device being disposed on the electrode in the first area, and the lens being supported by the first area; and
a cap disposed on the bench part,
the cap including a cap base, a pad electrode and a conductor, the cap including a cavity, a ceiling, a front wall, a first side wall, a first wing, and a rear wall, the cavity containing the semiconductor optical device and the lens, the pad electrode being disposed on the first wing, and the conductor being disposed on the cap base and connected to the pad electrode,
the second area of the bench surrounding the first area, the electrode on the second area being electrically connected to the conductor on the cap base,
the semiconductor optical device, the lens and the front wall and the rear wall of the cap being arranged on a principal surface of the bench part along an optical reference plane extending in a direction of a first axis, and
the ceiling extending along a first reference plane, the front wall having a front outer face extending along a second reference plane, the second reference plane intersecting with the first reference plane, the first wing being disposed on the first side wall, and the rear wall extending from the ceiling in a direction from the cap to the bench.

2. The optical module according to claim 1, wherein the cap base of the cap further includes a second side wall and a second wing, the second wing is disposed on the second side wall,
the first side wall and the second side wall extend in a direction of the front wall to the rear wall,
the front wall, the first side wall, the second side wall and the rear wall are disposed on the second area of the bench part, and
the semiconductor optical device and the lens are hermetically sealed by the cap and the bench of the second area.

3. The optical module according to claim 1, wherein the bench includes a silicon base, and
the silicon base of the bench has a principal surface with a recess for positioning the lens.

4. The optical module according to claim 1, wherein the bench part includes an insulating layer disposed on the electrode in the second area, the electrode includes a first portion, a second portion and a third portion, the first portion of the electrode extends on the first area to be connected to the second portion, the insulating layer extends across the second portion of the electrode, the second portion of the electrode is connected to the third portion, and the third portion of the electrode is connected to the conductor.

5. The optical module according to claim 1, wherein the cap includes an insulating layer disposed on the second area of the bench part, the conductor includes a first portion, a second portion and a third portion, the first portion of the conductor connects the pad electrode to the second portion of the conductor, the insulating layer extends across the second portion of the conductor, the second portion of the conductor is connected to the third portion of the conductor, and the second portion of the conductor is connected to the third portion of the conductor.

6. An optical apparatus including;
an optical module; and
an optical part,
the optical module including:
a bench part including a bench, an electrode, a semiconductor optical device, and a lens, the bench having a principal surface with a first area and a second area, the electrode being disposed on the first area and the second area, the semiconductor optical device being disposed on the electrode in the first area, and the lens being supported by the first area; and a cap disposed on the bench part, the cap including a cap base, a pad electrode and a conductor, the cap including a cavity, a ceiling, a front wall, a first side wall, a first wing, and a rear wall, the cavity containing the semiconductor optical device and the lens, the pad electrode being disposed on the first wing, and the conductor being disposed on the cap base and connected to the pad electrode, the second area of the bench surrounding the first area, the electrode on the second area being electrically connected to the conductor on the cap base, the semiconductor optical device, the lens and the front wall and the rear wall of the cap being arranged on a principal surface of the bench part along an optical reference plane extending in a direction of a first axis, and the ceiling extending along a first reference plane, the front wall having a front outer face extending along a second reference plane, the second reference plane intersecting with the first reference plane, the first wing being disposed on the first side wall, and the rear wall extending from the ceiling in a direction from the cap to the bench, the optical part supporting the front wall of the optical module, and the optical part being optically coupled to the semiconductor optical device through the front wall of the optical module, and the front wall of the cap being made of a material allowing light of the semiconductor optical device to pass through the front wall.

7. The optical apparatus according to claim 6, wherein the optical part includes a semiconductor integrated device having an optical grating coupler, and the optical grating coupler being optically coupled to the semiconductor optical device.

* * * * *